United States Patent
Yang et al.

(10) Patent No.: US 12,224,019 B2
(45) Date of Patent: Feb. 11, 2025

(54) CACHE PROCESSES WITH ADAPTIVE DYNAMIC START VOLTAGE CALCULATION FOR MEMORY DEVICES

(71) Applicant: Intel Corporation, Santa Clara, CA (US)

(72) Inventors: Xiang Yang, Santa Clara, CA (US); Ali Khakifirooz, Brookline, MA (US); Pranav Kalavade, San Jose, CA (US); Shantanu R. Rajwade, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 748 days.

(21) Appl. No.: 17/213,150

(22) Filed: Mar. 25, 2021

(65) Prior Publication Data
US 2022/0310178 A1 Sep. 29, 2022

(51) Int. Cl.
*G11C 16/00* (2006.01)
*G11C 7/10* (2006.01)
(Continued)

(52) U.S. Cl.
CPC ........ *G11C 16/3436* (2013.01); *G11C 7/1048* (2013.01); *G11C 16/102* (2013.01);
(Continued)

(58) Field of Classification Search
CPC ....... G11C 16/102; G11C 16/30; G11C 16/10; G11C 16/24; G11C 16/26; G11C 16/3404; G11C 16/3436; G11C 16/3459; G11C 7/1048; G11C 11/5628; G11C 11/5671; G11C 16/0483; G11C 16/08; G11C 16/16;
(Continued)

(56) References Cited

U.S. PATENT DOCUMENTS 10,224,107 B1 * 3/2019 Sule ....................... G11C 16/12

OTHER PUBLICATIONS

Kim, Chulbum et al., "11.4—A 512 GB 3b/cell 64-Stacked WL 3D V-NAND Flash Memory," Samsung Electronics, ISSCC 2017/ Session 11/ Non-Volatile Memory Solutions/11.4, IEEE International Solid-State Circuits Conference, 2017 (3 pages).

* cited by examiner

*Primary Examiner* — Thong Q Le
(74) *Attorney, Agent, or Firm* — Alliance IP, LLC

(57) ABSTRACT

A method, a memory chip controller of a flash memory device, and a flash memory device. The memory chip controller includes processing circuitry to receive data for a first page of N pages of data; and program cells of a memory location of the device to an nth threshold voltage level Ln, Ln corresponding to a program verify voltage level PVn, n being an integer from 0 to $2^N-1$, and Ln being one of $2^N$ threshold voltage levels achievable using the N pages of data. Programming the cells includes: programming the cells based on the data for the first page while receiving data for subsequent pages of the N pages; and programming the cells based on the data for the subsequent pages, wherein programming the cells includes, for at least n=1, causing a respective dynamic start voltage (DSV) to be applied to the cells based on each respective page number p of the N pages for which data is received at the memory chip controller for the memory location to achieve PV1.

20 Claims, 14 Drawing Sheets

(51) Int. Cl.
 *G11C 16/10* (2006.01)
 *G11C 16/24* (2006.01)
 *G11C 16/26* (2006.01)
 *G11C 16/30* (2006.01)
 *G11C 16/34* (2006.01)
(52) U.S. Cl.
 CPC .............. *G11C 16/24* (2013.01); *G11C 16/26* (2013.01); *G11C 16/30* (2013.01); *G11C 16/3404* (2013.01)
(58) Field of Classification Search
 CPC . G11C 16/20; G11C 16/28; G11C 2211/5642; G11C 5/02; G11C 7/222; G11C 8/08
 See application file for complete search history.

|        | L0 | L1 | L2 | L3 | L4 | L5 | L6 | L7 |
|--------|----|----|----|----|----|----|----|----|
| Page 1 | 1  | 1  | 1  | 1  | 0  | 0  | 0  | 0  |
| Page 2 | 1  | 1  | 0  | 0  | 0  | 0  | 1  | 1  |
| Page 3 | 1  | 0  | 0  | 1  | 1  | 0  | 0  | 1  |

FIG. 7A — 700A

|        | L0 | L1 | L2 | L3 | L4 | L5 | L6 | L7 |
|--------|----|----|----|----|----|----|----|----|
| Page 1 | 1  | 1  | 1  | 0  | 0  | 0  | 0  | 1  |
| Page 2 | 1  | 1  | 0  | 0  | 1  | 1  | 0  | 0  |
| Page 3 | 1  | 0  | 0  | 0  | 0  | 1  | 1  | 1  |

FIG. 7B — 700B

|        | L0 | L1 | L2 | L3 | L4 | L5 | L6 | L7 |
|--------|----|----|----|----|----|----|----|----|
| Page 1 | 1  | 1  | 1  | 1  | 0  | 0  | 0  | 0  |
| Page 2 | 1  | 1  | 0  | 0  | 0  | 1  | 1  | 0  |
| Page 3 | 1  | 0  | 0  | 1  | 1  | 1  | 0  | 0  |

FIG. 7C — 700C

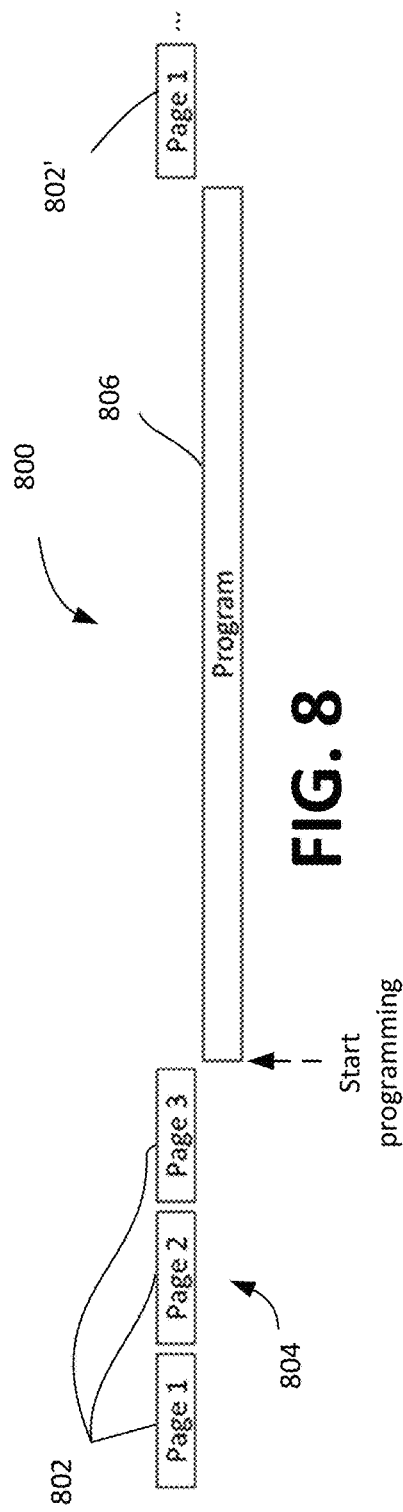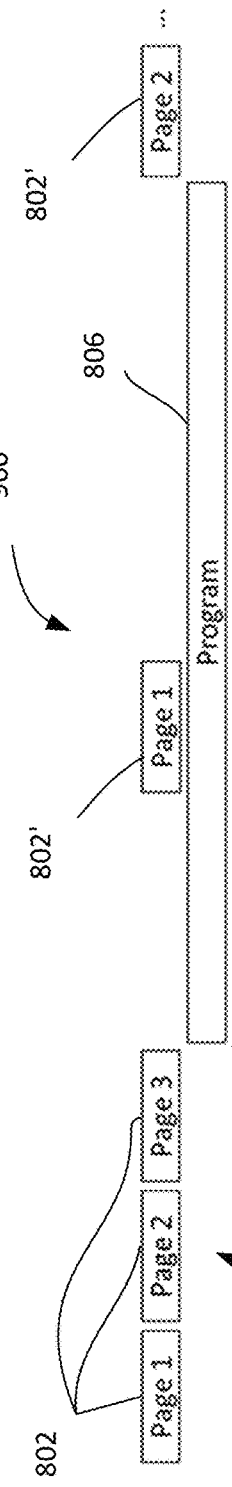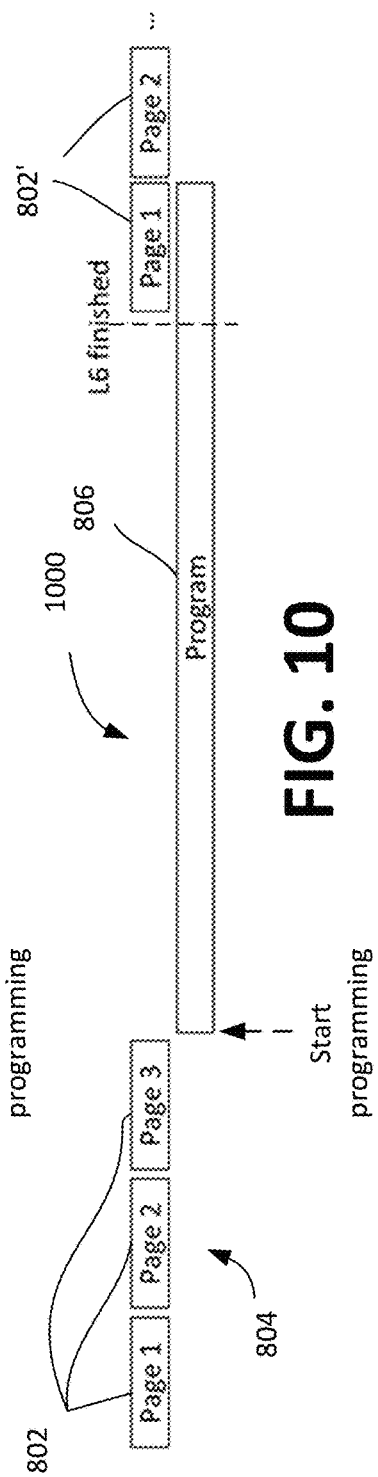

1700

1702 receiving, at a processing circuitry of an integrated circuit of a flash memory device, data for a first page of N pages of data

1704 programming cells of a memory location of the device to an nth threshold voltage level Ln, Ln corresponding to a program verify voltage level PVn, n being an integer from 0 to $2^N-1$, and Ln being one of $2^N$ threshold voltage levels achievable using the N pages of data 1704a programming the cells based on the data for the first page while receiving data for subsequent pages of the N pages 1704b programming the cells based on the data for the subsequent pages, wherein programming the cells includes, for at least n = 1, causing a respective dynamic start voltage (DSV) to be applied to the cells based on each respective page number p of the N pages for which data is received at the memory chip controller for the memory location to achieve PV1

FIG. 17

CACHE PROCESSES WITH ADAPTIVE DYNAMIC START VOLTAGE CALCULATION FOR MEMORY DEVICES

FIELD

The present disclosure relates in general to the field of computer development, and more specifically, to improving program speed in three-dimensional (3D) memory devices, such as in 3D NAND devices.

BACKGROUND

In 3D NAND devices, the caching of page data during program execution may reduce programming latency. However, mechanisms are needed for a reliable determination of dynamic start voltage in caching scenarios.

BRIEF DESCRIPTION OF THE DRAWINGS

FIGS. 7A-7C represent three distinct Gray code tables for a TLC memory structure.

FIG. 8 is a timing diagram according to the prior art for a non-caching scenario showing an input/output (IO) operation to receive three page of data and for a programming operation to program the three pages of data in a memory location.

FIG. 9 is a timing diagram similar to FIG. 8, but for a caching scenario involving the use of a single latch to cache page data for a subsequent memory location.

FIG. 10 is a timing diagram similar to FIG. 9, but for a caching scenario involving the use of a selected slow program convergence (SSPC) latch after a last threshold voltage to store page data for a subsequent memory location

FIG. 17 is a flow diagram of a process according to some embodiments.

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
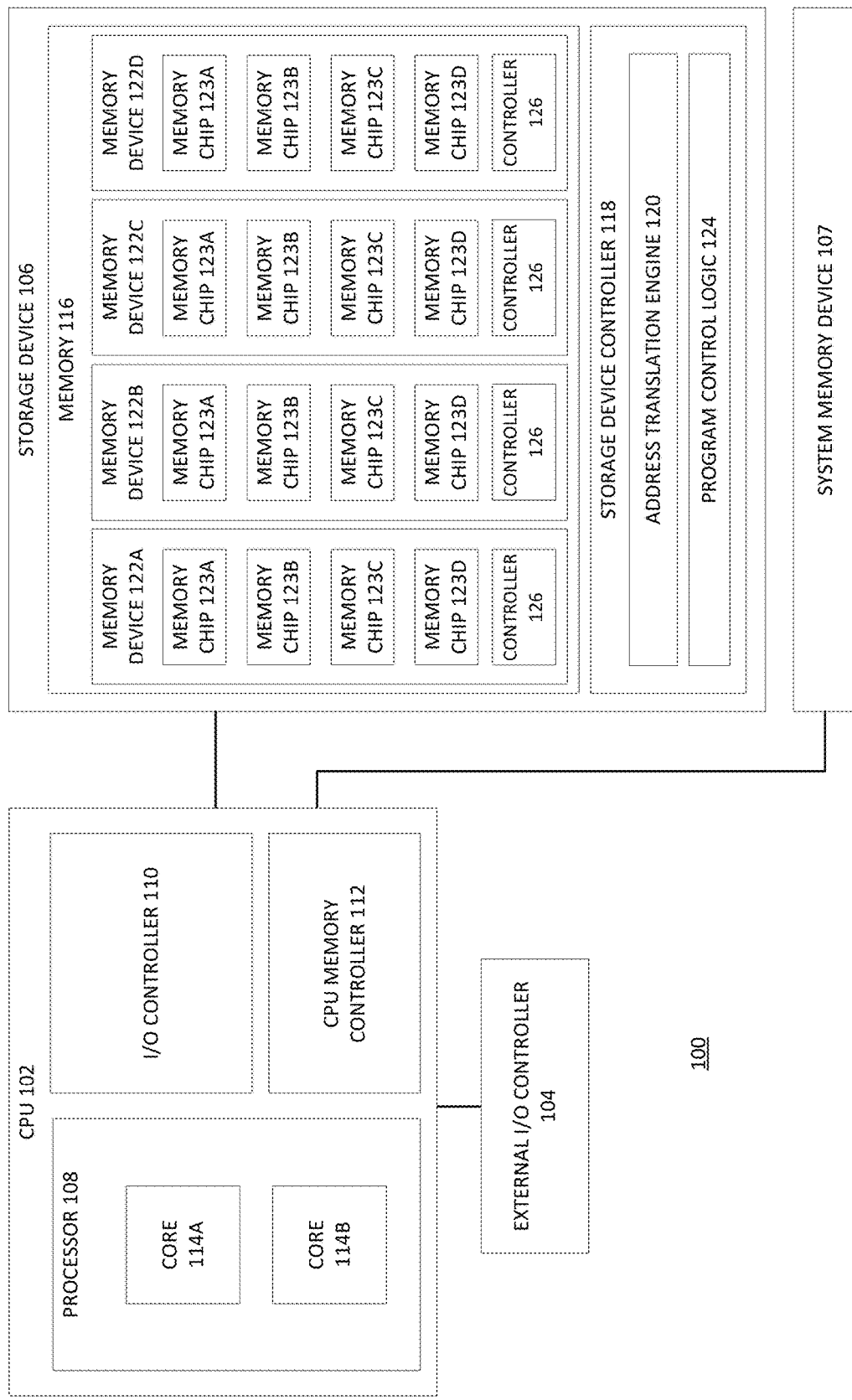
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, storage device 106, and system memory device 107. During operation, data may be transferred between storage device 106 or system memory device 107 and the CPU 102. In various embodiments, particular data operations (e.g., erase, program, and read operations) involving a storage device 106 or system memory device 107 may be managed by an operating system or other software application executed by processor 108.

In various embodiments, a storage device 106 comprises NAND flash memory (herein a storage device comprising NAND flash memory is referred to as a NAND flash storage device). In some embodiments, storage device 106 may be a solid-state drive; a memory card; a Universal Serial Bus (USB) flash drive; or memory integrated within a device such as a smartphone, camera, media player, or other computing device. In general, storage devices with NAND flash memory are classified by the number of bits stored by each memory cell. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array or on different arrays of the same device.

A storage device 106 may include any number of memories 116 and each memory 116 may include any number of memory devices 122 (e.g., 122A-D). In a particular embodiment, a memory device 122 may be or comprise a semiconductor package with one or more memory chips 123 (e.g., memory chips 123A-D). In the embodiment depicted, memory 116 includes memory devices 122A-D (while specific references herein may be made to memory device 122A, the other memory devices may have any suitable characteristics of memory device 122A) and memory device controller 126.

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 that may be coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store persistent data (e.g., a user's files or instruction sequences) that remains stored even after power to the system memory device 107 is removed. A system memory device 107 may be dedicated to a particular CPU 102 or shared with other devices (e.g., one or more other processors or other devices) of computer system 100.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that remains stored even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and a memory 116 comprising four memory devices 122A-D operable to store data, however, a storage device may include any suitable number of memory devices. A memory device 122A includes a plurality of memory cells that are each operable to store one or more bits. The cells of a memory device 122A may be arranged in any suitable fashion, such as in rows (e.g., wordlines or wordlines) and columns (e.g., bitlines or BLs), three dimensional structures, and/or other manner. In various embodiments, the cells may be logically grouped into banks, blocks, subblocks, planes, wordlines, pages, frames, bytes, or other suitable groups. In various embodiments, a memory device 122A comprises one or more NAND flash memory arrays.

A memory device 122A may include any of the volatile or non-volatile memories listed above or other suitable memory. In particular embodiments, memory device 122A includes non-volatile memory, such as planar or 3D NAND flash memory. In particular embodiments, a memory device 122A with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces. For example, a storage device 106 comprising NAND flash memory may receive a command that has a format compliant with a DDR-based standard and may translate the command into one or more commands that are compatible with NAND flash memory of the storage device 106. Similarly, the storage device 106 may format results from operations performed on the NAND flash memory into a format that is compliant with a DDR-based standard before transmitting the results to the CPU 102.

In a particular embodiment, a memory device 122 is a semiconductor package. In various embodiments, a semiconductor package may comprise a casing comprising one or more semiconductor dies (also referred to as chips) (e.g., memory chips 123A-D). A package may also comprise contact pins or leads used to connect to external circuits. However, a package is merely one example form a memory device 122 may take as a memory device may be any suitable arrangement of one or more memory arrays and associated logic in any suitable physical arrangement. For example, although a single physical package may include a single memory device 122, multiple memory devices 122 could be resident on a single package or a memory 122 could be spread across multiple packages.

A memory 116 may be embodied in one or more different physical mediums, such as a circuit board, die, disk drive, other medium, or any combination thereof (or combination with one or more packages). In a particular embodiment, memory 116 comprises a circuit board coupled to a plurality of memory devices 122 that each comprise a semiconductor package.

Storage device 106 may comprise any suitable type of memory and is not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices. Storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A storage device 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to a memory 116 (or memory devices(s) and/or memory chip(s) thereof), and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of a memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same circuit board or device as a memory 116 or on a different circuit board, or device. For example, in some environments, storage device controller 118 may be a centralized storage controller that manages memory operations for multiple different memories 116 (which may each be of the same type of memory or may be of different types) of computer system 100 (and thus may provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip or package as the storage device controller 118 or on a different chip or package.

In various embodiments, address translation engine 120 may include logic to store and update a mapping between a logical address space (e.g., an address space visible to a host computing device coupled to the storage device 106) and the physical address space of the memory 116 of the storage device 106 (which may or may not be exposed to the host computing device). The logical address space may expose a plurality of logical groups of data which are physically stored on corresponding physical groups of memory addressable through the physical address space of the storage device 106. A physical address of the physical address space may comprise any suitable information identifying a physical memory location (e.g., a location within a memory array of a memory 116) of the storage device 106, such as an identifier of the memory 116 on which the physical memory location is located, an identifier of the memory device 122A on which the physical memory location is located, one or more pages of the physical memory location, one or more subblocks of the physical memory location, one or more wordlines of the physical memory location, one or more BLs of the physical memory location, or other suitable identifiers or encodings thereof.

In various embodiments, the storage device 106 also includes program control logic 124 which alone or in combination with a memory device controller 126 is operable to control the programming sequence performed when data is written to a memory 116, the read sequence performed when data is read from a memory 116, or an erase sequence when data is erased from a memory 116. In various embodiments, program control logic 124 may be included in memory circuitry, and may provide the various voltages (or information indicating which voltages should be provided) that are applied to one or more memory cells, wordlines, BLs, and/or other portions of a memory array during the programming, reading, and/or erasing of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as a memory 116 and/or memory devices 122A-D.

In some embodiments, all, or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a host computing device (e.g., CPU 102) may be located on the same circuit board or on the same device and in other embodiments the storage device 106 and the host computing device may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a host computing device (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 2:
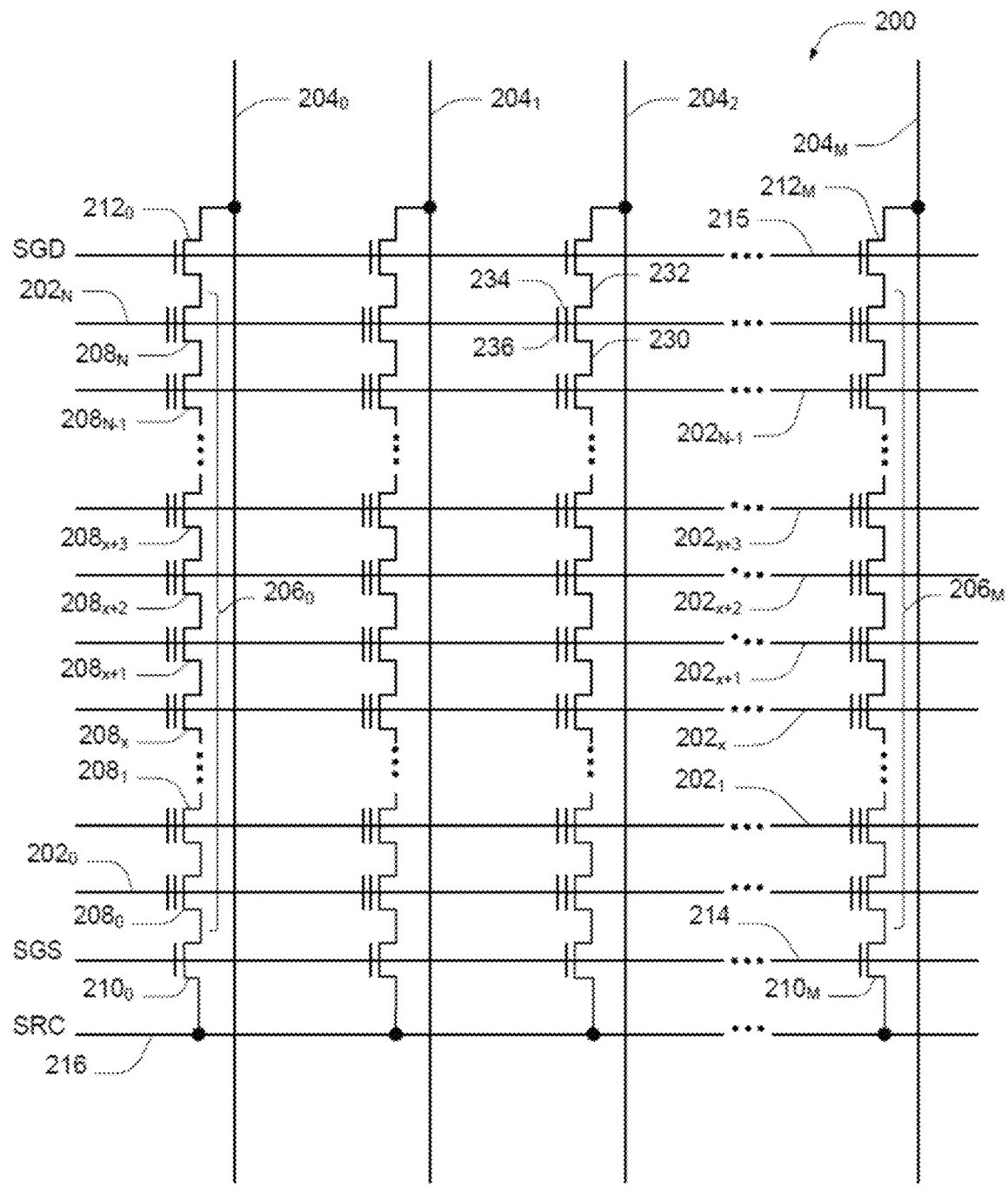
FIG. 2 illustrates an example portion of a NAND flash memory array in accordance with certain embodiments.

FIG. 2 illustrates an example portion of a NAND flash memory array 200 in accordance with certain embodiments. In various embodiments, memory device 122A includes an array 200 of memory cells logically arranged in rows and columns. Memory cells of a logical row are typically connected to the same access line (commonly referred to as a wordline) while memory cells of a logical column are typically selectively connected to the same data line (commonly referred to as a BL). In some embodiments, a single access line may be associated with more than one logical row of memory cells and a single data line may be associated with more than one logical column. Memory cells of the array are capable of being programmed to one of at least two data states (i.e., program levels).

Memory array 200 includes access lines, such as wordlines 2020 to 202N, and data lines, such as BLs 2040 to 204M. In some embodiments, the wordlines 202 may be connected to global access lines (e.g., global wordlines) in a many-to-one relationship.

Memory array 200 may be arranged in rows (each corresponding to a wordline 202) and columns (each corresponding to a bitline 204). Each column may include a string of series-connected memory cells, such as one of NAND strings 2060 to 206M. Each NAND string 206 may be connected (e.g., selectively connected) to a common source 216 and may include a plurality of memory cells. For example, NAND string 2060 includes memory cells 2080 to 208N. The memory cells 208 represent non-volatile memory cells for storage of data. The memory cells 208 of each NAND string 206 may be connected in series between a select transistor 210 (e.g., a field-effect transistor), such as one of the select transistors 2100 to 210M (e.g., that may each be a source select transistor), and a select transistor 212 (e.g., a field-effect transistor), such as one of the select transistors 2120 to 212M (e.g., that may each be a drain select transistor). Select transistors 2100 to 210M may be commonly connected to a select line 214 or select gate source (SGS), such as a source select line, and select transistors 2120 to 212M may be commonly connected to a select line 215 or select gate drain (SGD), such as a drain select line. In a particular embodiment, a SGD may be coupled to the drain select transistors of an entire subblock (and each subblock may have its own drain select line) while a SGS may be coupled to the source select transistors of an entire block (and each block may have its own source select line).

A source of each select transistor 210 may be connected to common source line (SRC) 216. The drain of each select transistor 210 may be connected to a memory cell 2080 of the corresponding NAND string 206. For example, the drain of select transistor 2100 may be connected to memory cell 2080 of the corresponding NAND string 2060. Therefore, each select transistor 210 may be configured to selectively couple a corresponding NAND string 206 to common source 216. A control gate of each select transistor 210 may be connected to select line 214.

The drain of each select transistor 212 may be connected to the bitline 204 for the corresponding NAND string 206. For example, the drain of select transistor 2120 may be connected to the bitline 2040 for the corresponding NAND string 2060. The source of each select transistor 212 may be connected to a memory cell of the corresponding NAND string 206. For example, the source of select transistor 2120 may be connected to memory cell 208N of the corresponding NAND string 2060. Therefore, each select transistor 212 may be configured to selectively connect a corresponding NAND string 206 to a corresponding bitline 204. A control gate of each select transistor 212 may be connected to select line SGD 215.

The memory array in FIG. 2 may be a quasi-two-dimensional memory array and may have a generally planar structure, e.g., where the common source 216, NAND strings 206 and BLs 204 extend in substantially parallel planes. Alternatively, the memory array in FIG. 2 may be a three-dimensional memory array, e.g., where NAND strings 206 may extend substantially perpendicular to a plane containing the common source SRC 216 and to a plane containing the BLs 204 (that may be substantially parallel to the plane containing the common source 216).

Typical construction of memory cells 208 includes a data-storage structure 234 (e.g., a floating gate, charge trap, etc.) that maintains a data state of the cell (e.g., through changes in threshold voltage), and a control gate 236. In some cases, memory cells 208 may further have a defined source 230 and a defined drain 232. Memory cells 208 have their control gates 236 connected to (and in some cases form) a wordline 202.

A column of the memory cells 208 is one or more NAND strings 206 selectively connected to a given bitline 204. A row of the memory cells 208 are memory cells commonly connected to a given wordline 202. A row of memory cells 208 may, but need not include all memory cells 208 commonly connected to a given wordline 202. Rows of memory cells 208 may often be divided into one or more groups of physical pages of memory cells 208, and physical pages of memory cells 208 often include every other memory cell 208 commonly connected to a given wordline 202. For example, memory cells 208 commonly connected to wordline 202N and selectively connected to even BLs 204 (e.g., BLs 2040, 2042, 2044, etc.) may be one physical page of memory cells 208 (e.g., even memory cells) while memory cells 208 commonly connected to wordline 202N and selectively connected to odd BLs 204 (e.g., BLs 2041, 2043, 2045, etc.) may be another physical page of memory cells 208 (e.g., odd memory cells). Although BLs 2043-2045 are not expressly depicted in FIG. 2, it is apparent from the figure that the BLs 204 of the array of memory cells 200 may be numbered consecutively from bitline 2040 to bitline 204M. Other groupings of memory cells 208 commonly connected to a given wordline 202 may also define a physical page of memory cells 208. For certain memory devices, all memory cells commonly connected to a given wordline may be deemed a physical page. For particular memory devices, all memory cells of a particular subblock commonly connected to a given wordline may be deemed a physical page. For example, memory cells that are coupled to a particular wordline in a subblock may comprise a first physical page, memory cells that are coupled to the particular wordline in a second subblock may comprise a second physical page, and so on. A bit from each memory cell of a physical page may be deemed a logical page. Thus, a single physical page may store multiple logical pages (e.g., a TLC scheme may store three logical pages in a single physical page).

In sensing (e.g., reading) a data state of a selected (e.g., target) memory cell, the memory cell is selectively activated in response to a particular voltage level applied to its control gate while current paths from the memory cell to the data line and to the source are established, thus permitting current flow, or lack thereof, between the data line and the source to indicate whether the memory cell has been activated in response to the particular voltage level applied to its control gate. For example, for a sensing operation of selected memory cell $208x+1$ of NAND string 2060, a sense voltage (e.g., a read voltage or a verify voltage) may be applied to the control gate of memory cell $208x+1$ while voltage levels are applied to the control gates of memory cells 2080 to $208x$ and $208x+2$ to 208N of NAND string 2060 sufficient to activate those memory cells regardless of their data states, and while voltage levels are applied to the control gates of select transistors 2100 and 2120 sufficient to activate those transistors. A sense operation that determines whether the memory cell $208x+1$ is activated in response to one or sense voltages may indicate one or more bits of the data state stored in that memory cell. In various embodiments, each memory cell 208 can be programmed according to an SLC, MLC, TLC, a QLC, or other encoding scheme. Each cell's threshold voltage (Vt) is indicative of the data that is stored in the cell.

Although various embodiments have been described with respect to a particular type of memory array (e.g., a NAND flash memory array), the teachings of the various embodiments may be equally applicable to any type of memory arrays (e.g., AND arrays, NOR arrays, etc.), including those recited herein or similar memory arrays.

Figure 3:
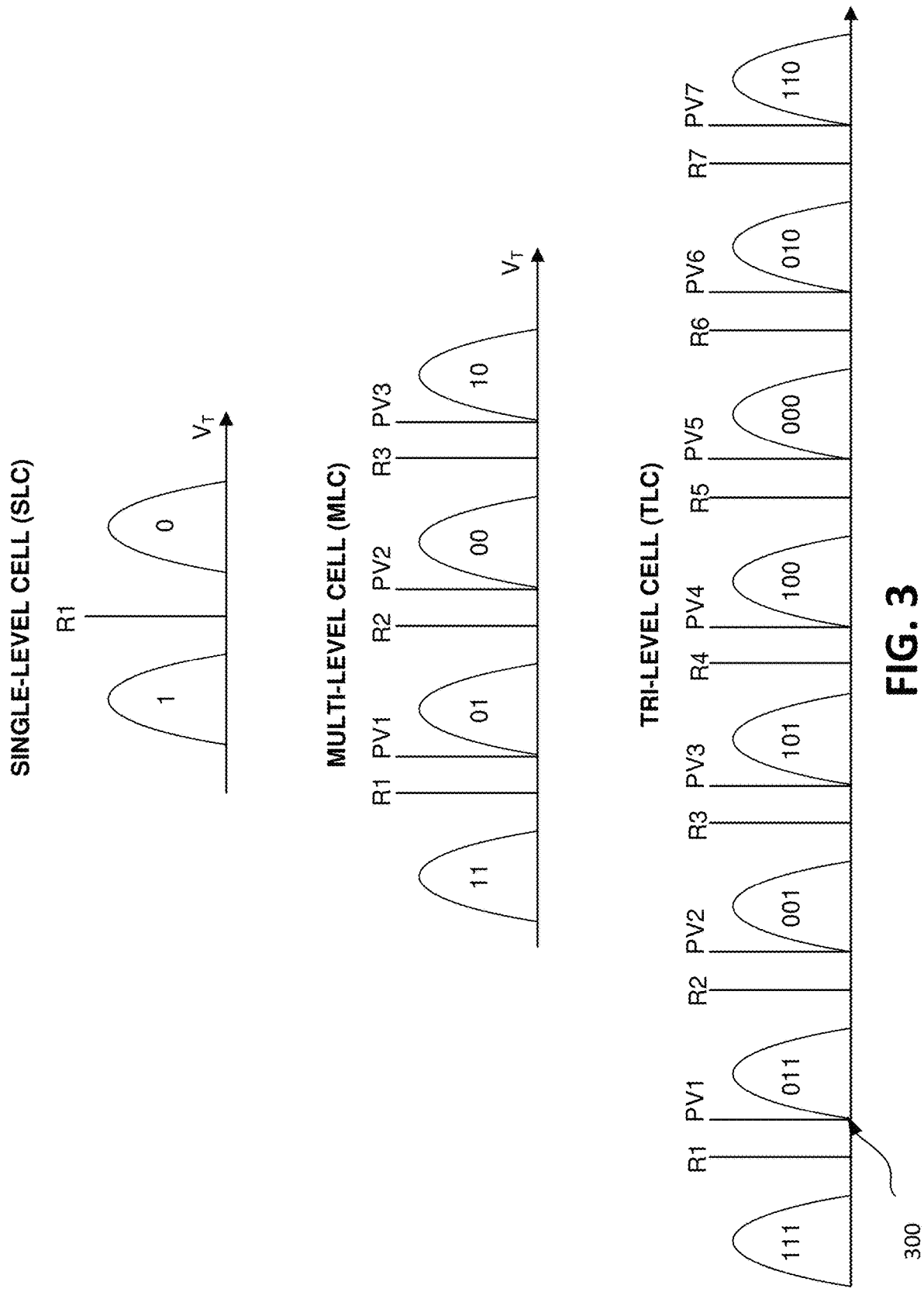
FIG. 3 illustrates example encodings of bits in the form of a threshold voltage distribution within NAND flash memory cells in accordance with certain embodiments.

FIG. 3 illustrates example encodings of bits within NAND flash memory cells 208 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted elliptical regions. In other words, a program level may correspond to one of the bit encodings used in the encoding scheme. In general, if a cell is to store the value represented by the lowest voltage region, the cell does not need to be programmed (since in its erased state it already has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, and the QLC scheme has fifteen program levels. When data (e.g., one or more pages) is written to memory 116, a plurality of the cells may be programmed to a first program level, a plurality of the cells may be programmed to a second program level, and so on.

The various R voltage values depicted in FIG. 3 (e.g., R1, R2, R3, . . . ) represent read voltages that may be applied to a wordline when the values of cells coupled to that wordline are being read. When a particular read voltage is applied, sense circuitry may determine whether the threshold value of a cell is greater than or less than the read voltage based on a voltage or current sensed by the sense circuitry via the bitline of the cell. Although not shown in FIG. 3, a QLC encoding scheme may utilize a similar scheme where fifteen read voltages may be used to resolve the values of four bits within each cell, where R1<R2<R3< . . . <R15.

The various program verify voltages (PV1-PV3 in the MLC encoding scheme and PV1-PV7 in the TLC encoding scheme) depicted represent program verify voltages that may be applied to a cell during programming of the cell (e.g., during a program verify operation) to determine whether the threshold voltage of the cell has reached its desired level. For example, in the MLC encoding scheme, if the cell is to be programmed to "01" (i.e., program level 1), then PV1 may be applied to the cell during a verify procedure and if sensing circuitry determines that the threshold voltage of the cell is greater than PV1, then the cell is considered to have passed programming. If the threshold voltage of the cell is less than PV1, the cell is considered to not have passed programming and the storage device 106 may attempt to raise the threshold voltage of the cell or may allow the cell to fail and may later attempt error correction on the cell. As another example, if the cell is to be programmed to "00" (i.e., program level 2), then PV2 may be applied to the cell during a verify procedure and if sensing circuitry determines that the threshold voltage of the cell is greater than PV2, then the cell is considered to have passed programming. Similarly, if the cell is to be programmed to "10" (i.e., program level 3), then PV3 may be applied to the cell during a verify procedure. Any suitable program verify voltages may be used for any of the encoding schemes. In particular embodiments and as depicted, the program verify voltage may be set to a value that is at or near the beginning of the corresponding threshold voltage range. In various embodiments, there may be some margin between a program verify voltage and a corresponding read level voltage to allow for slight threshold voltage droppage over time and to improve sensing accuracy. For example, the figure depicts a margin between R1 and PV1, a margin between R2 and PV2, and so on.

In particular embodiments, cells may be programmed one or more pages (e.g., logical pages) at a time, where a page is stored in a group of cells (e.g., a physical page) that are coupled to the same wordline. For example, the group of cells that is programmed may be identified by a particular wordline and a particular subblock. The group of cells may store one page of data (if the cells are encoded according to an SLC scheme) or multiple pages of data (if the cells are encoded according to an MLC, TLC, QLC, or other multi-level encoding scheme).

Figure 4:
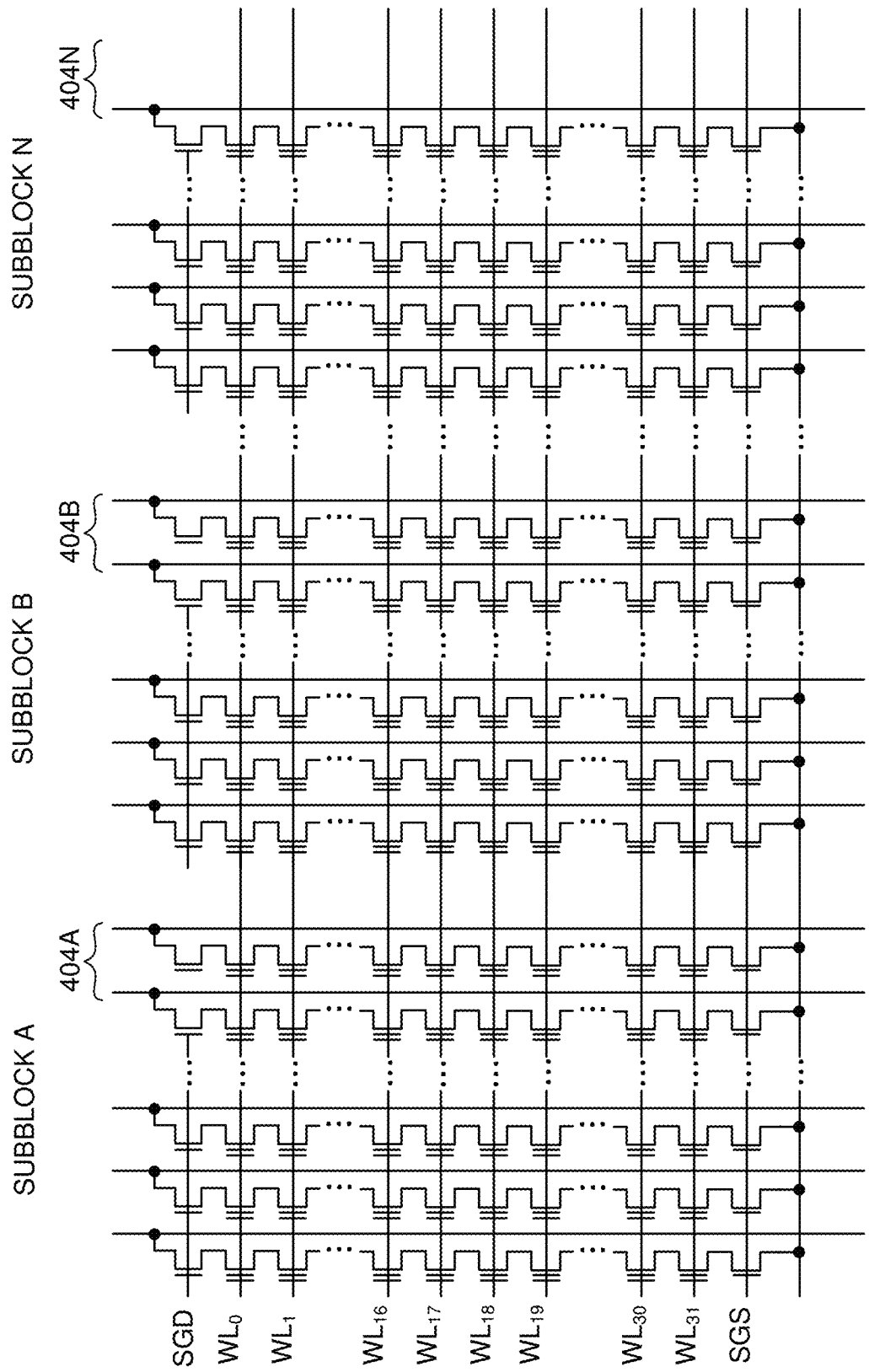
FIG. 4 illustrates example subblocks of a block of a memory device in accordance with certain embodiments.

FIG. 4 depicts memory cells of a memory array arranged into a plurality of subblocks (subblocks 404A-404N) in accordance with certain embodiments. In a particular embodiment, memory cells of an array 200 of chip 123 may be arranged into subblocks and blocks. As an example, a subblock may comprise a number of series strings and a block may comprise a number of subblocks. In various embodiments, a source select line (controlled by source gate select signal SGS) is shared by each series string of a block and each series string of a particular subblock shares a drain select line (controlled by drain gate select signal SGD) with each subblock having its own drain select line.

In a particular embodiment, a subblock may contain a single physical page of memory for each wordline of the subblock (in other embodiments, a subblock may contain multiple physical pages of memory for each wordline). Thus, a block of memory may be divided into a large number of physical pages. As described above, a logical page may be a unit of programming or reading that contains a number of bits equal to the number of cells in a physical page. In a memory that stores one bit per cell (e.g., an SLC memory), one physical page stores one logical page of data. In a memory that stores two bits per cell (e.g., an MLC memory), a physical page stores two logical pages.

Figure 5:
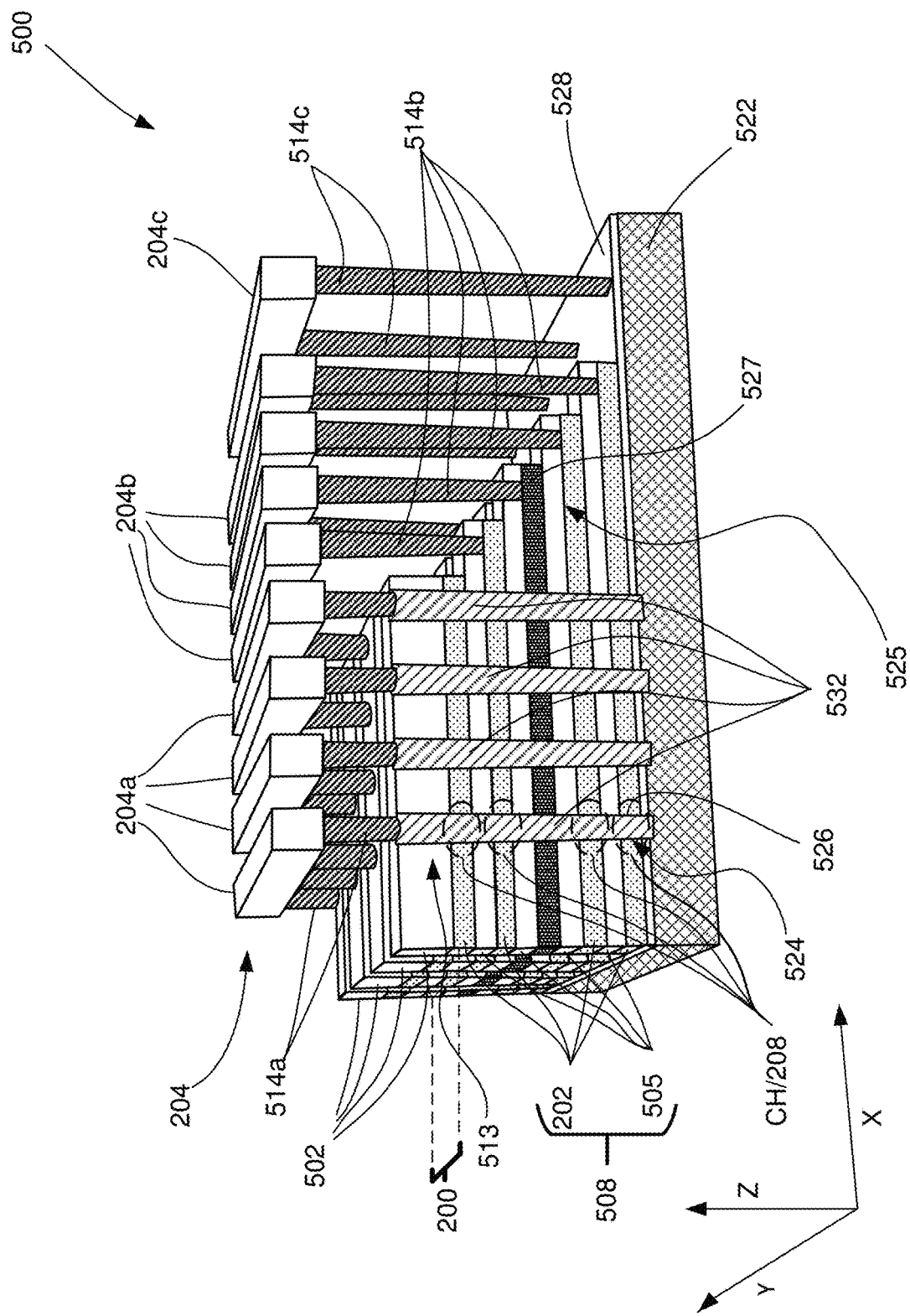
FIG. 5 illustrates a schematic, perspective view of a tile of a 3D NAND device according to one embodiment.

FIG. 5 illustrates an example perspective view diagram of a tile 500 of 3D NAND flash memory arrays, such as a stack of arrays similar to array 200 of FIG. 2. A tile of memory blocks includes several memory blocks, e.g., 200 blocks, where each block is comprised of a stack (e.g., a 32 tier stack) of memory cell pages. Each memory cell block 502 includes a wordline stack, each stack including a plurality of wordlines 202 and a plurality of interlayer dielectrics/interlayer dielectric layers 505. The wordlines 202 are interposed between the interlayer dielectrics 505 (collectively, a wordline stack 508) in an alternating manner, according to one embodiment. The wordlines 202 are a simplified representations of a number of wordlines (e.g., 32 wordlines or more) that may be included in a NAND 3D memory array, such as a NAND 3D memory array corresponding to FIG. 2. At least some of wordlines 202 may correspond to wordlines 202 of FIG. 2. The wordlines 202 are conductive layers such as silicon layers or polysilicon layers, according to one embodiment. The interlayer dielectrics 505 are simplified representation of a number of dielectric layers that may be used to separate the wordlines 202, according to one embodiment. The interlayer dielectrics 505 may include oxide layers, according to one embodiment. Referring still to FIG. 5, tile 500 further includes bitlines 204a and contact lines 204b and 204c extending substantially perpendicularly to the wordlines 202 or blocks 502 in the shown embodiment.

Tile 500 of FIG. 5 is supported by a substrate structure 522 with an insulating layer (now shown) that encompasses the shown tile 500. The insulating layer may be formed of an insulating material, such as a bonding dielectric layer, having a predetermined thickness, and including, for example, at least one of, for example, SiO, SiN, SiCN, SiOC, SiON, and SiOCN.

Tile 500 is situated on a substrate structure or substrate 522, such as a silicon substrate, which includes control circuitry therein (not shown), such as control circuitry including transistors, row decoders, page buffers, etc. Pillars 513 are disposed to penetrate the stacks and to define channels CH. First contact structures 514a connect BLs 204a to respective channels CH and thus couple the BLs 204a to corresponding memory cells 208 defined by the channels CH. Memory cells 208 may correspond to memory cells 208 of FIG. 2. BLs 204a may correspond to BLs 204 of FIG. 2. Second contact structures 514b are configured to apply a signal to the wordlines 202, and are connected to contact lines 204b as shown. Third contact structures 514c are configured to connect contact lines (one of which is shown) 204c directly to control circuitry within the substrate structure 522. The control circuitry of substrate structure 522 may include, for example, circuitry of a controller, such as controller 126 of FIG. 1, circuitry of a storage device controller, such as storage device controller 118 of FIG. 1 including program control logic 124. Each row of wordlines 202 across multiple blocks 202 extending in the Y direction and including the corresponding channel sections as coupled to corresponding BLs would define a memory array 200, and may correspond to a memory array such as memory array 200 of FIG. 2. As shown in FIG. 5, a plug 527 may be provided between stacks of wordlines to define decks of the memory device on each side of the plug. It is to be noted that the memory device of FIG. 5 is merely a schematic depiction, and that a device implementation may include a number of plugs to define multiple decks in a memory device.

The wordlines 202 may be disposed to form a staircase 525, shown in FIG. 5, in the X direction and to form a staircase (not shown) in the Y direction. A predetermined region, including end portions of the wordlines 202, may be exposed by the steps. In the regions, the wordlines 202 may be connected to first contact structures 514a. The wordlines 202 may be disposed to be separated in predetermined units by separation regions in the Y direction. The wordlines 202 may constitute a single memory block between a pair of the separation regions, but the scope of the memory block is not limited thereto.

The interlayer dielectrics 505 may be disposed between the wordlines 202. Similarly to the wordlines 202, the interlayer dielectrics 505 may be spaced apart from each other in both the Y direction and the Z direction. The interlayer dielectrics 505 may include an insulating material, such as a silicon oxide or a silicon nitride. The channels CH may be spaced apart from each other, while forming rows in the Y direction and columns in the Z direction. In example embodiments, the channels CH may be disposed to form a lattice pattern or may be disposed in a zigzag manner in one direction. Each of the channels CH may have a pillar shape and be part of a pillar 532 of multiple similar pillars extending through the blocks 502, and may have an inclined side surface which becomes narrower as it comes close to the substrate structure 522. Other shapes for the pillars and channels are possible for embodiments.

A channel region 524 may define each of the channels CH, and corresponds to a memory cell of a memory array 200, such as cells 208 of FIG. 2. In each of the channels CH, the channel region 524 may be formed to have an annular shape. However, in other example embodiments, the channel region 524 may be formed to have a circular shape or a prismatic shape. The pillars 532 may be connected to an epitaxial layer 528 above substrate structure 522. The pillars may include a semiconductor material, such as polycrystalline silicon or monocrystalline silicon. The semiconductor material may be an undoped material or a material containing p-type or n-type impurities.

A gate dielectric layer 526 may be disposed between the wordlines 202 and the channel region 524. Although not illustrated in detail, the gate dielectric layer 526 may include a tunneling layer, a charge storage layer, and a blocking layer which are sequentially stacked from the channel region 524. The tunneling layer may be configured to tunnel charges to the charge storage layer and may include, for example, silicon oxide (SiO.sub.2), silicon nitride (Si.sub.3N.sub.4), silicon oxynitride (SiON), or combinations thereof. The charge storage layer may be a charge trapping layer or a floating gate conductive layer. The blocking layer may include silicon oxide (SiO.sub.2), silicon nitride (Si.sub.3N.sub.4), oxynitride (SiON), a high-k dielectric material, or combinations thereof.

First, second and third contact structures 514a, 514b and 514c, BLs 204a, and contact lines 204b and 204c, which are interconnection structures for forming an electrical connection to the substrate structure 522, may include a conductive material. The interconnection structures may include, for example, tungsten (W), aluminum (Al), copper (Cu), tungsten nitride (WN), tantalum nitride (TaN), titanium nitride (TiN), or combinations thereof. Each of the contact structures may have a cylindrical shape. In example embodiments, each of the first and second contact structures may have an inclined side surface which becomes narrower as it comes close to the substrate structure 522.

In multi-level per cell NAND flash memory, memory cells may be programmed in any of $2^N$ possible states to represent N pages of data. For example, in a three-level per cell (TLC) memory, each cell may be programmed into one of $2^3$ possible threshold voltage levels, L0 to L7, based on three pages of data being programmed. If four pages of data were to be programmed in the NAND cell, there would then be 16 levels, L0 to L15.

Figure 6:
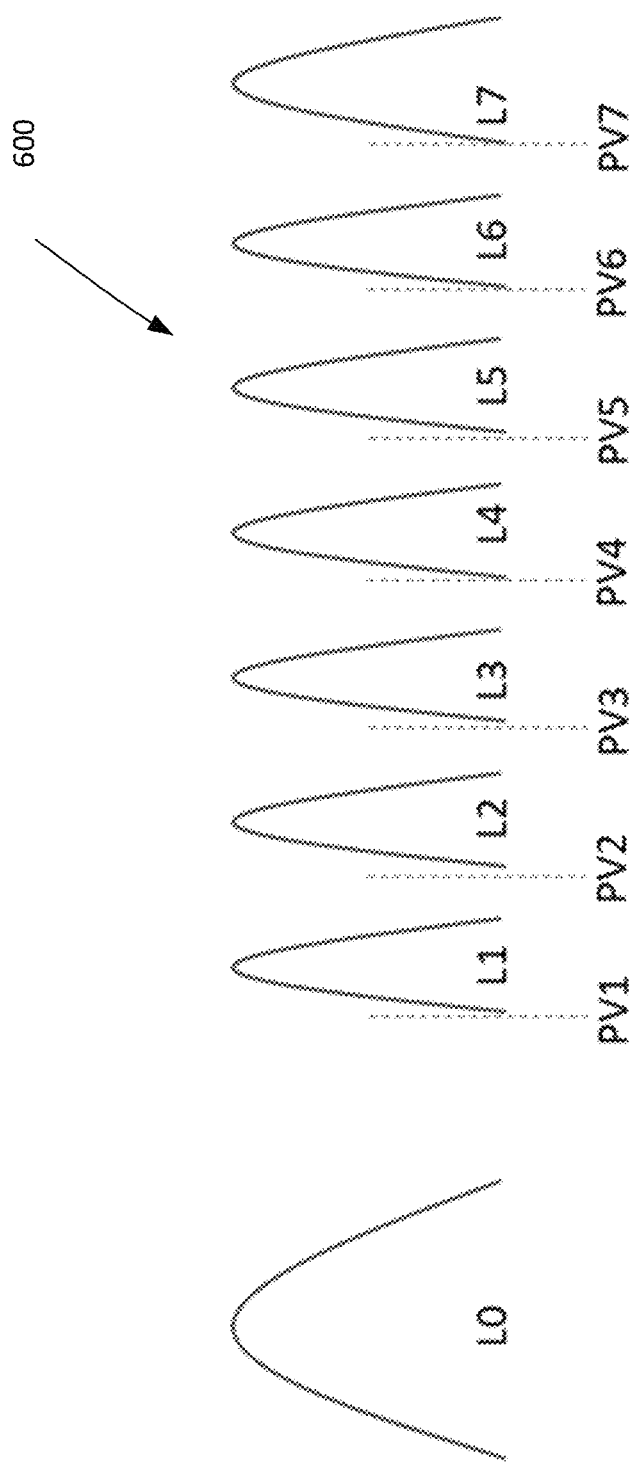
FIG. 6 is a representation of an exemplary threshold voltage distribution of a NAND cell in a three level cell (TLC) memory structure.

The three-page scenario is shown schematically in FIG. 6, which is a representation of the threshold voltage distribution 600 of a NAND cell in a TLC memory structure. As seen in FIG. 6, the threshold voltage increases from L0 to L7, with L0 representing no programming, and L7 representing the highest threshold voltage for a given memory cell. As also seen in FIG. 6, verify voltages PV1 through PV7 correspond to respective verify voltage levels against which the voltage of a given cell is verified by the memory chip controller. Verification against PVn (with n representing the number of the threshold voltage level Ln, such as, for the case of 3 pages to be programmed, n being from 1 to 7 to correspond to levels L1 to L7) to see whether the desired threshold voltage for the given cell has been reached. Based on the latter, the memory chip controller may determine whether to inhibit applying further programming pulses to the selected WL if the cell has "passed verify at PVn", i.e., if its threshold voltage is higher than PVn or whether to continue programming the cell during subsequent program pulses if the cell has not yet reached PVn, and optionally whether to slow down the programming of the cell in the event that the voltage of the cell when being verified is within a predetermined voltage difference with respect to PVn. The predetermined voltage difference may be preprogrammed in the memory chip controller.

To program the cells in a given memory location (or "location"), a series of program (voltage) pulses with increasing voltage magnitudes (to correspond to the increasing possible voltage levels L1-L7) may be applied to a selected wordline that corresponds to that location. Each program pulse may be followed by a set of verify steps as noted above to compare the actual threshold voltage of the cells against a predefined program verify level PV1 to PV7. Cells whose threshold voltage has passed the desired verify level may, as noted above, be inhibited from receiving subsequent program pulses during the given round of programming. To inhibit any given cell from being programmed (from receiving a program pulse), usually, the memory chip controller may apply a voltage such as 2-3 V applied to the bitline corresponding to that given cell during subsequent program pulses, whereas the BLs corresponding to the cells being programmed receive a low voltage, such as 0V, during a next/subsequent program pulse application. Additionally, cells whose threshold voltage is close to their desired verify level, but has not passed verify (i.e. has not reached PVn), may be identified and programmed at a slower rate in subsequent programming pulse according to selective slow program convergence (SSPC) method. This can be achieved for example by applying an intermediate voltage between inhibit voltage and 0V to the bitline for that given cell that is to be subject to the SSPC method.

To operate a programming algorithm according to some embodiments as described above by way of example, a flash memory chip such as a NAND chip may include a chip controller that is configured to allocate a set of data latches for each bitline. For example, a TLC memory device (adapted to store 3 pages of data in a cell) may contain 5 data latches in total for each bitline, where each set of 5 data latches is to maintain: (1) three bits of data corresponding to 3 pages of data being programmed, (2) a latch to indicate if a bitline is being inhibited, and (3) a latch to indicate whether the bitline is to receive an SSPC voltage. In some embodiments however, a TLC memory device may contain 4 data latches per bitline instead of 5: (1) three latches to maintain 3 bits corresponding to 3 pages of data being programmed, and (2) one latch to indicate whether the bitline is to receive SSPC voltage. BLs being inhibited are marked by converting their data latches so that they correspond to L0.

The pages of data being programmed may be assigned to the threshold voltages accordioning to a Gray code, as demonstrated by way of example in the tables 700A, 700B and 700C of, respectively, FIGS. 7A, 7B and 7C. "Gray codes" represents distinct sets of bit values, with each set representing the total number of pages being programmed (in the case of FIGS. 7A-7C for example, 3 pages), and with each distinct set of values of a set representing a dedicated threshold voltage level of a cell. For example, referring to the Gray code table of FIG. 7A, the distinct set of bit values 111 corresponding to pages 1-3, respectively, is to represent the dedicated threshold voltage level L0 for any given cell, whereas the distinct set of bit values 000 corresponding to pages 1-3 is to represent the dedicated threshold voltage level L5 for any given cell. Referring by way of example to FIG. 7B, similarly, the distinct set of bit values 111 corresponding to pages 1-3, respectively, is to represent the dedicated threshold voltage level L0 for any given cell, whereas the distinct set of bit values 000 corresponding to pages 1-3 is to represent the dedicated threshold voltage level L3 for any given cell. Referring by way of example to FIG. 7C, similarly, the distinct set of bit values 111 corresponding to pages 1-3, respectively, is to represent the dedicated threshold voltage level L0 for any given cell, whereas the distinct set of bit values 000 corresponding to pages 1-3 is to represent the dedicated threshold voltage level L7 for any given cell.

The Gray code tables shown by way of example in FIGS. 7A-7C are by no means meant to be limiting, and embodiments contemplate to use of any configuration of Gray codes for any number of pages as will become apparent as the instant description progresses. At a minimum, a Gray code table is to allow distinguishing, for a first pulse of a programming round (with each programming round to program a given memory location across the different levels L0-L7 in a TLC memory device).

According to some embodiments, a flash memory chip controller, such as controller 126 of FIG. 1, may be configured to, after receiving data for a first page for a memory location, and while programming cells at the memory location based on the data for the first page, receiving data corresponding to one or more subsequent pages for programming within the memory location.

To program data into a memory device, such as a flash memory device, typically a system-level controller for the flash memory device, for example a storage device controller, such as storage device controller 118 of FIG. 1, for example a SSD controller, may send a program command including the cell address where the data is being programmed, the data being programmed, and a confirmation command to indicate that the data stream of the program command has finished. There may be one program command per page to be programmed, and the sequence of fields within a program command may then be repeated for the number of pages being programmed in a given memory location. The data to be programmed may be sent to the storage device controller by a user, such as by CPU 102 of FIG. 1.

The programming sequence 800 for a TLC according to the state of the art is shown in FIG. 8.

For example, referring to the timing diagram 800 of FIG. 8, to program a TLC memory device, a memory controller may send 3 sets of program commands including a program command, address, data, and command confirmation, with one program command 802 per page, and one set 804 of program commands per memory location to be programmed. The program commands for the respective pages may follow each other sequentially, and, after the chip controller of a memory chip to which the instructions were addressed receives the confirmation for the very last page to be programmed, the memory device controller, such as controller 126 of FIG. 1, may start the programming algorithm 806 to in fact program a given memory location with the received data corresponding to the number of pages. During programming, the memory die/chip is busy, and may not accept new program commands, until the programming for the given memory location has been completed. After the program operation is finished, the memory chip controller, such as controller 126, may inform the storage device controller, such as controller 118 of FIG. 1, that it is ready to receive the next program command. The storage device controller may now send another set of program commands 802' to program the next location on the memory. In this case, the effective program throughput is determined by the sum of the program time (TPROG) corresponding to the execution of the program command 806, and the time it takes to send 3 pages of data to the memory device, corresponding to the time duration of sending each of program commands 802, referred to herein as a TIO time duration. The total time duration of sending all program commands 802 is N*TIO, with N corresponding to the total number of pages to be programmed (data corresponding to each page being written into a specific memory location), in the case of FIG. 8, 3*TIO.

After a set of program commands is received for the total number of pages, in this case, 3 pages, the memory chip controller, such as controller 126, may execute the program command as noted above. Execution of the program command by the chip controller will need time: time to apply the program pulse, and, after each pulse, time to verify whether the voltage of the cell being programmed at the level n dictated by the set of program commands being implemented has reached its PVn destination. If the chip controller determines that the cell has passed verify at PVn, it may determine to inhibit the cell from subsequent pulses as the program is being executed. If the chip controller determines the cell has not passed verify at PVn, it may keep applying pulses successively to move the cell's threshold voltage higher and higher until the PVn destination (and hence the desired level Ln dictated by the set of program commands being executed) is reached.

From the standpoint of the storage device controller 118, once the program commands with the data are sent to the memory chip, the memory chip will start its programming operation, and the total latency that the storage device controller 118 would see is the total time it takes to send the program commands, and the total time it takes for the memory chip to execute the program command, and let the storage device controller know of its new status regarding whether execution of the program command is complete. Thus, for 3 pages of data, if receiving the program command for each page takes 100 microseconds, and the execution of the program command takes another 1500 microseconds, the total latency seen from the standpoint of the storage device controller would be 1800 microseconds.

According to some embodiments, caching within latches may be performed in order to both receive page data and execute a program command in parallel. Caching has been used in SLC and in multi-level cells, such as TLC memories. Caching within latches may involve, while executing a program command on a first memory location of a memory chip, using a bitline latch within the memory chip to store data for one or more pages to be programmed in a second, different memory location of the memory chip. Thus, in caching, at least some of the TIO for location 2 may be happen at the same time as TPROG for location 1.

For programming purposes, a user, such as CPU 102 of FIG. 1, may send 3 pages (3 bits) of data, and the data may be physically programmed in a given memory location of a memory chip addressed by the storage device controller. Each cell within the memory location currently being programmed may be in one of $2^N$ possible states, where N is the total number of pages to be programmed. In this case, each cell within the memory location being programmed may be in one of eight possible states L0-L7. Three latches are needed per bitline corresponding to the location being programmed in order to maintain the 3 bits of data that are to be programmed in that location while the memory chip controller is executing the program command on the given memory location. In order to execute the program command, the memory chip controller, starts from all cells at the memory location to be or being programmed (the program location) at L0 (all cells at the program location erased or never programmed). The memory chip controller would then start applying voltage pulses to gradually move the distribution of threshold voltages for the cells at the program location from L0 to L7 according to the information in the program commands for the three pages to be programmed at each cell of the program location. Reference in this respect is again made to FIG. 6, which shows the voltage distributions for a TLC memory device. The memory chip controller, during programming, after each pulse applied, may compare the threshold voltage level of the cell at the program location against the intended verify level PVn (which corresponds to the next PV level n after the last PV level n−1 has passed verify). For any cell that has reached its PV verify level, the memory chip controller may mark that cell as an "inhibit" cell (by controlling the bitline analog voltage for that cell during subsequent pulses so that the voltage of the cell does not move past its intended level). For example, if the bitline voltage is a negligible voltage, about 0 V for example, then the cell would continue to respond with increased voltage during each program pulse (not inhibited). However, if the bitline voltage is not negligible, for example between about 2V to about 3V, the cell associated with that bitline within the program location may be inhibited from responding to further program pulses.

In addition to the above, a SSPC regime may be applied as part of the caching regime described above. According to the SSPC regime, as part of the verify step, as noted previously, an intermediate voltage may be applied to the bitline by the memory chip controller between the inhibit voltage and 0V to the bitline for the given cell that is close to verification of the PVn level. For example, after the first pulse, during verification against PV1, is a cell is very close (e.g. within about 100 to about 200 mV) from PV1, the cell may be marked for SSPC. In such a case, a next pulse applied to the bitline for the cell may be non-negligible, for example between about 0.5V and about 1.5V, in which case application of the next pulse would result in the voltage of the cell moving, but not as much as when the bitline is at a negligible voltage, such as ground or 0 V. The latches per bitline allow the maintaining of information not only regarding the page data bits to be programmed, but also regarding whether a cell corresponding to the bitline may be inhibited, and optionally whether the cell may be a SSPC candidate for the next pulse.

Let us now refer to the timing diagram 900 of FIG. 9. In the option of FIG. 9, the memory chip may be equipped with one additional latch per bitline (additional to: latches for page data, a latch for inhibit, and optionally a latch for SSPC) to accommodate caching the data for the next program location while the memory chip controller is performing the program operation. In this case, as soon as the memory starts execution of the program command 806 (at the start of TPROG) it may inform the storage device controller its ready status (i.e., that it is ready to receive the program command including the data for the next program location, and associated address). The storage device controller, such as controller 126 of FIG. 1, may then send one or more of the next program commands 802'. The In this case, the effective throughput concerning programming of the data within the next program commands may be determined by TPROG+2 TIO if one of the next program commands 802'

Referring now to the timing diagram 1000 of FIG. 10, a second option, takes advantage of the fact that the last level, $L(2^N-1)$, in the case of a TLC with N=3, L7, does not need to be placed in terms of voltage distribution (see for example FIG. 6) as tightly as other levels. Where an SSPC regime is an option (that is, where a latch exists per bitline for SSPC), the last level may be verified without the use of SSPC given the amount of room available in terms of voltage distribution (referring in this context by way of example to FIG. 6, which suggests among other things that PV7 may be "overshot" to a larger extent without surpassing L7). According to this second option, after the memory chip controller determines that L6 is fully placed (has passed verify), it may free up the bitline latch used to maintain SSPC information, and may inform the storage device controller that it is ready to accept the next program command or instruction as shown in FIG. 10. The storage device controller may then send the next program command 802' during TPROG 806 corresponding to programming pertaining to program commands 802. Keep in mind that the role of SSPC is to allow the application of a voltage pulse in between a regular pulse and zero and to make the voltage distribution at various levels closer to one another, that is, "tighter," given that one has a given range of threshold voltages available within which to spread the various threshold voltages corresponding to the various levels L0-L($2^N$–1). Where a TLC is involved, when it comes to L7, however, an upper range from the last level is no longer relevant (one is not concerned about staying within a narrow voltage band so as not to impinge upon the next/upper voltage level). As a result, the SSPC regime would not be needed for level L($2^N$–1). Therefore, after programming of L($2^N$–2) is finished, in the case of a TLC, L6, the chip controller may determine not to use SSPC for L($2^N$–1). In such a case, the chip controller may use the SSPC latch as a free latch to allow data to be stored at that latch for a subsequent memory location during programming of L($2^N$–1).

Figure 11:
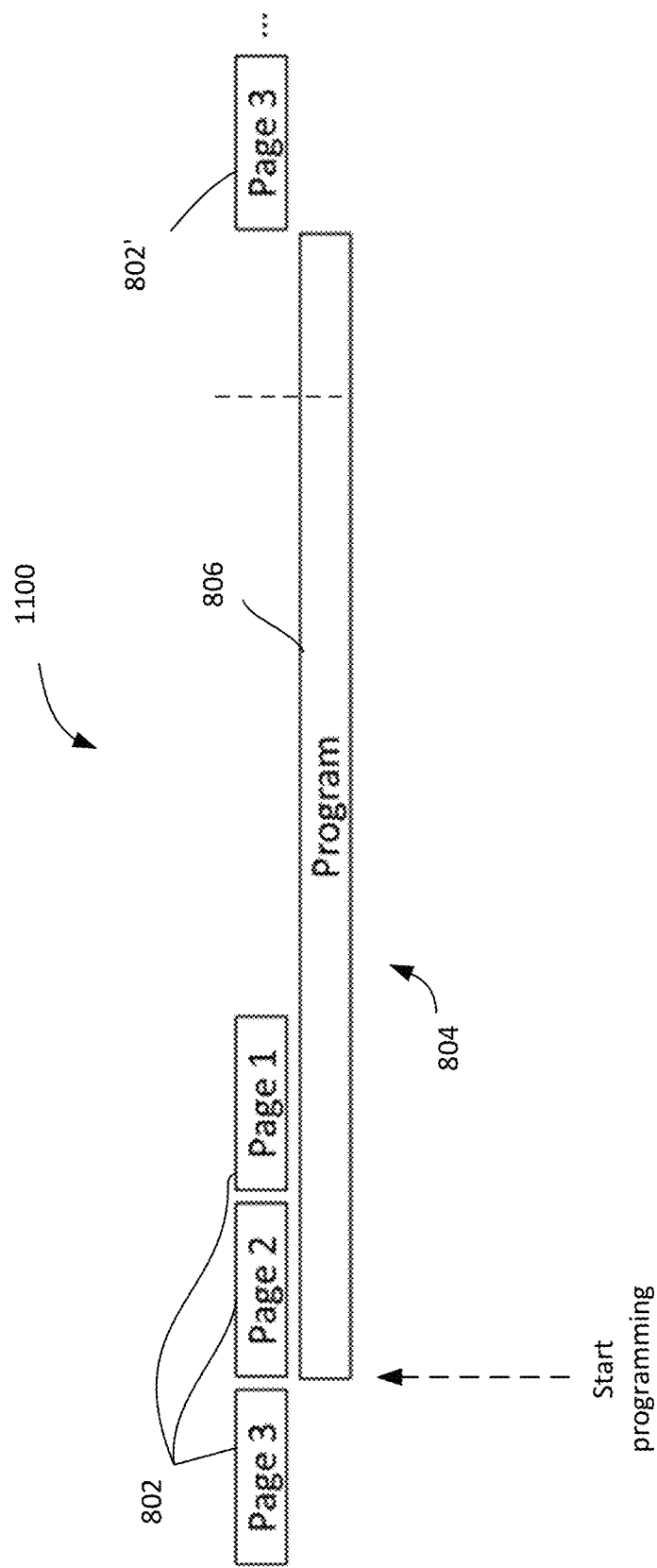
FIG. 11 is a timing diagram similar to FIG. 9, for a caching scenario involving the use of a Gray code table to guess threshold voltage levels of cells of a memory location being programmed.

Referring now to the timing diagram 1100 of FIG. 11, according to a third option, the memory chip controller may start program operation as soon as it receives the first page of data. In this case, the first page being sent to the memory chip controller should be the one that allow the memory chip controller to distinguish between L0 and L1. In the example of FIG. 11, the first page being sent that would allow distinguishing between L0 and L1 would be, for the example Gray codes of FIGS. 7A-7C, Page 3 based on the Gray codes for FIGS. 7A, 7B and 7C. The memory chip controller may, according to this third option, proceed with applying program pulses and verifying the threshold voltage of cells against PV1 at the memory location being programmed with Page 3 (802), while at the same time allowing the program command and data for the next Page 2 to by processed by the memory chip controller in parallel. In the shown example of the Gray codes of FIGS. 7A-7C, Page 2 should be the one that distinguishes between L1 and L2. If the memory chip controller does not receive Page 2 by the time the threshold voltage of the cells at the location being programmed is slightly above PV2, it may need to take a pause, until it receives this data. Once the memory chip controller receives Page 2, it may proceed with the program operation while receiving data corresponding to the third page, i.e. Page 1. Similarly, if the memory chip controller does not receive Page 1 by the time the threshold voltage of cells is slightly above PV3, it may take a pause. Once the memory chip controller receives Page 1, it may progress with the rest of the program operation, as schematically shown in FIG. 11.

In the first and second options as explained with respect to FIGS. 9 and 10 respectively, the start time of the program operation (the start time of the memory chip controller implementing the program command) corresponds to a time at which one or more latches allow data for next location to be sent to the memory chip controller. In the third option as explained by way of example in the context of FIG. 11, the memory chip controller may start the program operation as soon as it has received the very first page of data out of the three that allows distinguishing between L0 and L1. In this same third option, the memory chip controller may, in the meantime, also allow the $2^{nd}$ and $3^{rd}$ pages be received, but to begin with, it would need the first page only, using the Gray code regime as explained with respect to FIG. 11.

For a TLC device, one way of assigning L0 to L7 to a given cell is to set the threshold voltage of a given cell based on 3 pages of data that are to be sent for programming. For example, according to the Gray codes of FIGS. 7A-7C, if Pages 1, 2 and 3 correspond to data 111 for cell X, then the bit for cell X will go to L0, and if Pages 1, 2 and 3 correspond to data 110 for cell X, then the bit for cell X will go to L1 according to the Gray codes of FIGS. 7A-7C. The set of Page 1-Page 3 data values that the memory chip controller receives is to determine the program level of cell X. Therefore, if the memory chip controller is to know which cell of the given location to be programmed goes to which threshold voltage level, it would need the three pages of data sent by the user (e.g. the CPU 102 through the storage device controller 118 of FIG. 1 sending in 16 KB or 64 KB of data) in a TLC device corresponding to three numbers, with the program operation to proceed to program cells at the memory location from the lowest to the highest threshold voltage, including verifying that each cell has reached its destination level $L_n$, and, if it has, to inhibit its further programming.

Referring back to the Gray code examples of FIGS. 7A-7C, and to FIG. 11, as noted previously, the first page that is received is to correspond to the first page that allows a distinction between L0 and L1. Let us, by way of example and for the purposes of illustration only, refer to the Gray code table of FIG. 7A. The moment the memory chip controller receives Page 3, it can determine whether to program the cells at that given location with L0 or not. The decision would not be perfect, as, for example, if Page 3 has a value of 1 the cells could be at L0, or L3 or L4 or L7, and if it is 0, it could be L1, L2, L5 or L6. However, according to the third option, since the memory chip controller knows the Page number being programmed (i.e. Page 3, Page 2 or Page 1), when receiving the data for Page 3, all the memory chip controller needs to know is whether the first page data, in our example the Page 3 data, corresponds to L0 or higher for the cells at the memory location being programmed. Therefore, if the memory chip controller receives a Page 3 data corresponding to the value 1 (knowing that the Page 3 data is the first page to be received in the example of the Gray code of FIG. 7A), the memory chip controller would know that the cells at memory location being programmed are to be at L0, and would therefore inhibit those cells from being further programmed. If the memory chip controller receives a Page 3 data corresponding to the value 0 (again, knowing that the Page 3 data is the first in the example of the Gray code of FIG. 7A), the memory chip controller would know that the cells at memory location being programmed are to be at L1 or above, and, as a result, will cause a first pulse to be applied to the cells at the memory location being programmed. Although a value of 0, according to the Gray code regime of FIG. 7A for example, could mean L1, L2, L5 or L6 for the cells being programmed at the given memory location, since the memory chip controller would know that Page 3 is the first page to be received, it would perform a verify against PV1 (rather than PV2, PV5, or PV6). While the data corresponding to Page 3 is being programmed, the memory chip controller can receive Page 2, the next page. In that case, the memory chip controller would have two bits of information for any location: the value corresponding to Page 3, and the value corresponding to Page 2. Referring still to the example Gray code of FIG. 7A, if the values are 10, the cells being programmed at the given memory location could be at L1 or L6; if the values are 00, the cells being programmed at the given memory location could be at L2 or L5; if the values are 01, the cells being programmed at the given memory location could be at L3 or L4. Therefore, as the data for Page 2 is coming in, if the memory chip controller receives values for Page 3 and Page 2 that correspond to anything other than 11, respectively (which values corresponds to L0 or L7), the memory chip controller may apply a program pulse to the cells at the memory location being programmed, and verify the voltage of the cells at the memory location against PV1 or PV2 depending on the data for Page 3 and Page 2. While the data corresponding to Page 2 is being programmed, the memory chip controller can receive Page 1, the next page. In that case, the memory chip controller would have three bits of information for any memory location being programmed: the value corresponding to Page 3, the value corresponding to Page 2, and the value corresponding to Page 1, at which point it would program the cells at the location being programmed based on the values having been received. Option 3 involves applying a first program pulse and verifying it again PV1, while allowing Page 2 to be received, and then applying a second pulse while verifying against PV1 and PV2 while receiving Page 1. Thus, option 3 involves the act of receiving Page 2 and Page 1 at the same time during a portion of the programming time.

The memory chip controller is to verify against threshold voltages moving in ascending order starting from the next threshold voltage level corresponding to the Ln for which further programming was last inhibited. The Gray codes would, according to the shown example, need to provide a distinction for the data in Page 3, the first page received, as between L0 and L1. The Gray codes would, according to the shown example, need to provide a distinction for the data in Page 2, the next page received, as between L1 and L2. In general, the Gray codes may provide a distinction for the data in Page m as between Lm−1 and Lm up to m=N−1, where N is the total number of Pages. Thus for a TLC, the distinction for the data would need to be between L0 and L1 first, and then between L1 and L2 next, and that is where the need for distinction would stop, as Page 3 would provide all the data needed to distinguish between levels. This is so that once a verifying against a given Lm has been inhibited, the memory chip controller could start verification based on the threshold voltage of Lm+1.

According to the third option, the memory chip controller starts implementing the program command as soon as it receives the data for the first page (in our example above, Page 3) that distinguishes between L0 and L1. If the memory chip controller is ready to accept the next set of data, it will receive the next page from the storage device controller (e.g. when it has determined that the first page data does not correspond to L0 in which case it would inhibit further pulses to the cells at that memory location). For first page data that does not correspond to L0, the memory chip controller may then apply the first program pulse or program voltage (VPGM), and verify the voltage of the cells at the memory location being programmed against PV1 to pre-verify whether the cells are at L1. If the cell threshold voltages are above PV1, the memory chip controller may inhibit their further programming, and if the cell threshold voltages are close enough to PV1 (e.g. at PPV), the memory chip controller may mark them as SSPC according to the SSPC regime describe above. The memory chip controller may take a pause (stop sending waveforms into the memory location being programmed) and receive the next page of data to distinguish between L1 and L2, and apply one more pulse and move forward with further verification (e.g. against PV1 if Page 2 is a 1 (meaning the level could be L1 or L6 for the Gray code of FIG. 7A)), and/or against PV2 if Page 2 is a 0 (meaning the level could be L2 or L5 for the Gray code of FIG. 7A). Once the memory chip controller has finished the verify operation based on the receipt of Page 2, it may then wait for the third page, and, as soon as it has received it, it can move to programming the memory location according to well-known methods.

If a QLC memory device is used, another latch may be added to accommodate a fourth page of data. In such a case, features of option 3 and of option 2 may be combined, in which case the memory chip controller may start programming as soon as it receives the first page that allows distinguishing between L0 and L1, and where, as soon as the next to last level is reached, that is L6, the empty latch typically used for SSPC may be used to carry data for an additional page for another memory location to be programmed while L7 is being programmed.

Once the memory chip controller has received the first page according to option 3, and completed the verify operation against PV1 without having received the next page of data, it may wait for the next page of data while polling the storage device controller until it receives the second page of data. At the time of receiving the second page of data, the memory chip controller distinguishes as to which cells are inhibited and which cells are to be programmed during the second pulse. If inhibited, the memory chip controller is to apply a slight voltage to the bitline, such as about 2-3 V by way of example. If not inhibited, the memory chip controller is to ensure the bitline is at ground voltage to allow programming.

The above embodiments (options 1, 2 and 3 and other described alternatives) may be combined to fully perform the I/O operation of data in parallel with the program operation. For example, the memory chip controller may start program operation as soon as it receives Page 3, allow Page 2 and Page 1 to be received while it performs the program and allow Page 3 of the next location to be received after L6 is finished and SSPC information is no longer needed.

Referring to FIG. 1, according to one example, the memory chip controller may starts program operation according to the third option above as soon as the data of Page 3 is received by it. The memory chip controller 126 is coupled to storage device controller 118 to receive the next page of data, in our example, Page 2. Memory chip controller 126 may observe that it has finished its PV1 verify, at which time it may wait (that is, pause sending voltage waveforms to the bitlines corresponding to the memory location being programmed), poll the storage controller until it receives data for the second page of data and begin programming that data.

The memory chip controller may look up received data for the various pages against Gray code table values as explained above. The memory chip controller may send status information to the storage device controller regarding its readiness to receive additional program commands. The status information may indicate that the memory chip controller has a "ready" status, meaning that it is ready to receive data, in this manner allowing the storage device controller to send the next program command. Another status may indicate that the memory chip controller is in programming mode, but still ready to receive data. Various examples of memory chip controller statuses that the memory chip controller may communicate to the storage device controller, and that may cause the storage device controller to determine its next action, may include, by way of example, one or more of:

1) programming in progress based on first page of data to distinguish between L0 and L1, and ready to receive further page data;
2) idle, the programming based on the received page data has been completed, currently polling and ready for next page of data;
3) programming in progress based on the second page of data to distinguish between L1 and L2, and ready to receive further page data;
4) programming in progress, all data for memory location received, and ready for data for next memory location;
5) programming in progress and all data has been received;
6) programming in progress, and not ready to receive further page data; and/or
7) idle and ready to receive further page data.

The memory chip controller status information allows the storage device controller to prioritize the sending of page data. Since the storage device controller may have many tasks related to one or more memory chip controllers, having status information as noted above from the one or more memory chip controllers may allow the storage device controller to determine to prioritize the sending of the second page of data to a memory controller doing the programming where the status is indicated as ready to receive further page data. If the storage device has limited power, by having information not only on whether a memory chip controller is programming or not programming, but also on whether it is idle and waiting for further data (e.g. status item (2) above), or programming and ready to accept further data (e.g. status items (1) and (3) above), it may prioritize its operations based on such status as a function of its remaining power budget. Having information on whether a memory chip controller coupled to the storage device controller is idle (not applying voltage waveforms to the bitlines of a given memory location being programmed) or programming (applying voltage waveforms to the bitlines of a given memory location being programmed) will allow the storage device controller to determine where it can best apply its resources. For example, where the storage device controller is power limited, it may prioritize sending page data to a memory chip controller that is idle and therefore not in need of as much power over a memory chip that is programming and therefore in need of more power. Therefore, according to one embodiment, the storage device controller may adjust its operation based on status information from memory chip controller regarding whether they are or are not in the processing of programming.

In some applications, such as enterprise applications, a memory device, such as the memory chip controllers of the memory device, may be equipped with an algorithm to protect the in-flight data, i.e. data is in flight between the storage device controller and a memory chip controllers for programming, against power loss. The memory device may be equipped with a capacitor or other energy storage device configured to allow operation of the memory chip controller for a few milliseconds in order for the data to be programmed. In such a case, the storage device controller may inform one or more of the memory chip controllers of a power loss by toggling a pin designated to communicate such information. Upon receiving the power loss signal, the memory chip controller may program the in-flight data in a mode that is faster than a regular (non-power-saving mode) and that hence requires less energy. For example, a memory chip controller informed of a power loss by the storage device controller may, based on such information, program the in-flight data in single-level per cell (SLC) mode and in a pre-designated location.

In the prior art, as schematically depicted in FIG. 8 described above, since three pages of data, Page 1, Page 2, and Page 3, are in-flight (sent to the memory chip controller and to be programmed), the memory device may need to be equipped with enough energy storage to allow programming 3 pages of data into SLC mode.

In the first option, as shown in FIG. 9, up to 4 pages of the data are in-flight: Page 1 to 3 of the memory location being programmed, and Page 1 of the next memory location to be programmed. In this case, the memory device, such as the memory chip controller, may be equipped with enough energy storage to allow programming 4 pages of data to SLC, i.e. 33% more than prior art.

In the second option, as shown in FIG. 10, also up to 4 pages of data are in-flight: Page 1 to 3 of the memory location being programmed, and Page 1 of the next memory location to be programmed. However, Page 1 of the next location may be received only after L6 finishes programming. In such a scenario, it may be more energy efficient for the memory chip controller to simply finish the TLC programming in the current location and only program Page 1 of the next location into SLC. Hence the required energy storage may be the same as in the prior art.

In the third option, as depicted in FIG. 11, only 3 pages of data are in-flight and there is no difference in power loss algorithm compared to the prior art.

A program operation within the memory chip controller may be adapted to implement a procedure to dynamically calculate an optimum start voltage for programming. Such dynamic start voltage (DSV) calculation helps to reduce program time by avoiding the need to start with too small a program voltage that might otherwise need to account for changes through cycling, temperature, or variation. DSV determination may be performed by counting the number of cells at a given memory location being programmed that pass PV1 after a program pulse is applied, and calculating an optimum start voltage once a pre-specified number of cells pass PV1. The pre-specified number many be any number based on application needs, such as, by way of example only, 100. Such DSV counting and calculation may, according to an embodiment, be performed for sample locations, for example the first location on a wordline or a group of neighboring wordlines to reduce the time overhead of DSV measurements and calculation. Counting may be performed on cells targeted for L1 only, i.e. ⅛ of the cells, or on all cells being programmed, i.e. L1-L7, or ⅞ of the cells, assuming fully random data distribution amongst the cells. The former case is preferred since a lesser number of cells are being counted and hence latency of counting process is reduced.

In the third option shown in FIG. 11, prior to receiving Page 2, the memory chip controller cannot distinguish between all 8 levels, L0-L7, as noted previously. For example, with the Gray code of FIG. 7(C), prior to receiving Page 2, the memory chip controller cannot distinguish between L1, L2, L6 and L7. In other words, when attempting to count the number of "L1" cells that pass PV1, it will count a number of cells that is 4 times larger than the true L1 cells that pass verify at PV1.

According to some embodiments, prior to receiving Page 2, the memory chip controller may determine DSV by sampling ¼ of the cells in order to count those that have passed PV1 verify. In the event that the DSV criteria are not met before Page 2 is received, a different sampling may be needed, such as a sampling of a larger fraction of the cells at the memory location to be programmed. After receipt of Page 2 at the memory chip controller, with Page 3 and Page 2 available, the memory chip controller still cannot distinguish between two levels, for example L1 and L6, with the Gray code of FIG. 7(C). Hence, DSV calculation may be done by sampling ½ of the "L1" cells that pass PV1. Once Page 1 is received, DSV calculation may proceed according to well-known methods.

According to some embodiments, as described by way of example above, assuming a random data distribution amongst the cells of a memory location to be programmed according to the third option (one described by way of example in the context of FIG. 11, where programming begins as soon as data for the first page is received and where additional page data is received during such programming), and further assuming that $2^n/2^N$ bits will be at level $L_n$ where N is the total number of pages to be programmed in a given memory location, the memory chip controller may be configured to at least one of:
  a. apply a pulse voltage to cells of a memory location, sample $2^n/2^N$ fraction of cells at the memory location for PVn verify for n≤N, and determine whether the number of the sampled cells that pass PVn verify is equal to or above a pre-specified threshold T, such as, for example T=100; if yes, set the optimum starting voltage for subsequent programming for PVn verify at the pulse voltage; or
  b. apply a pulse voltage to cells of a memory location, and, without sampling, determine whether $(2^N/2^n*M)$ cells are at PVn, with N representing the total number of pages to be programmed, n the PV level, and M representing a pre-specified number of cells, for example M=100.

According to the above embodiment, the memory chip controller is to implement an algorithm to calculate the optimum voltage to start the program operation. For example, if the memory chip controller were to start with a too high programming voltage, it may overshoot the PV level sought to be reached during programming (an overshoot). With an overshoot, if the first pulse is so high that, right after it, cell threshold voltages pass PV1 by an appreciable amount, such as, for example, 1-2V, there would not be a way to pull the cells' threshold voltage voltages back down unless those cells go through an erase procedure, which is time consuming. It would be best for the memory chip controller to start low on program pulses. For example, if 15 V is the right voltage pulse to get cells at the memory location being programmed to reach a threshold voltage of PV1, it would be best not to start at 16 V which would result in an overshoot. However, starting off at a 12 V pulse would result in reaching PV1 only very slowly, therefore wasting time and adding to latency as the voltage is moved higher and higher to see if PV1 is reached. A DSV algorithm involves calculating an optimum start voltage so that the very first programming pulse for a given PV level results in at least a portion of the cells being programmed reaching the given PV level (i.e. being at a threshold voltage equal to or just equal to the given PV level).

An exemplary manner of determining the optimum start voltage for a given level PVn may be as follows. During a DSV determination operation, the memory chip controller may apply a pulse conservatively, that is, using a relatively low pulse voltage, and check if any cells at the memory location being programmed have or have not passed PVn for example with n=1. Once a predetermined number of cells (e.g. T from a. above, or $(2^N/2^n*M)$ from b. above) has passed PVn at a last pulse voltage applied, the memory chip controller may determine to keep using the same last voltage applied that resulted in the predetermined number of cells having passed PVn as the starting pulse voltage for the next memory location to be programmed at PVn. For example, if the memory chip controller determines, during the DSV operation, that to reach PV1 for a given memory location, a pulse of 14.5V resulted in the predetermined number of cells having passed PV1 verify, the memory chip controller, for one or more subsequent memory locations to be programmed, would determine to start at a 14.5 V pulse to program cells at the next memory location for a PV1 verify.

According to the state of the art, the memory chip controller would know, during a DSV operation, at the first pulse that it would apply, which cells at the memory location being programmed are to be at which level, since it would have had the three pages of data for example for a TLC by the time it begins programming. See FIG. 8 by way of Example. For example, in a random distribution of threshold voltage levels, with 16 KB of data, if there are 8 levels L0-L7, and data is randomly distributed within the memory locations and across the memory device, there would be an assumption of 16 KB/8 levels or 2 KB of data at each level L0-L7, meaning that 2K*8 bits of data, or 16000 bits of data, would exist at each level, including at L1. The predetermined number of cells to have passed PVn to allow a determination of the optimum start voltage to reach PVn for subsequent memory locations may be based on T or M as noted at items a. and b. above, respectively.

Where caching is involved, for example as explained in the context of the third option as shown in the example of FIG. 11, after the memory chip controller receives the first page, Page 3, and begins programming by applying the first pulse for PV1 verify, at that stage, the memory chip controller would know whether the cells at the memory location being programmed are at L0 on the one hand, or, potentially, using the Gray code of FIG. 7(C) by way of example, at either of L1, L2, L6 or L7 on the other hand (and which of L1, L2, L6 or L7 is the targeted level will be unknown to the memory chip controller at the time of applying the first pulse), since we are using caching as explained in the context of the third option of FIG. 11.

In such a case, without any adjustments, when determining an optimum pulse voltage for programming at PVn, the pre-specified number T or M based on which the optimum pulse voltage would be determined would not be 100 out of 16000 bits as in a non-caching scenario (recall that for 16 KB of data, we are assuming a random distribution of threshold voltages at 16000 bits per level), but 100 out of $x_p*16000$ bits, where $x_p$ represents the number of possible threshold voltage levels that could correspond to the already received page data in a Gray code scheme used in the context of the third option as described by way of example in relation to FIG. 11. Such sampling may not be optimal to determine the optimal starting voltage for a PVn verify, since the pool of cells from which sampling would be done would be much larger.

For instance, where the first page has been received and has a value of 0 when programming a TLC memory location, $x_p=4$ (there are four threshold voltage levels). For example, referring to the Gray code of FIG. 7(C), 4 levels, L1, L2, L6 and L7, could correspond to the already received first page data if the first page data has a value of 0 (noting that first page data with the value of 1 would signify a L0 level). For example, referring still to the Gray code of FIG. 7(C), 2 levels, L2 and L7, could correspond to the already received first page data and second page data if both page data have a value of 0.

According to some embodiments, $x_p = 2^{(N-p)}$ where p is the page number (as in first page (Page 3 of FIG. 11), second page (Page 2 of FIG. 11), or third page (Page 1 of FIG. 11)). $x_p$ therefore refers to the population of cells in the memory location being programmed from which the pre-specified number of cells would go through verify against PVn, and effectively corresponds to the inverse of the sampling size of the cell population at a memory location for DSV calculation as set forth in option (a) above where $2^n/2^N$ fraction of cells is sampled.

According to some embodiments, the memory chip controller may, in a DSV operation involving caching of page data, base a calculation of the DSV/optimum starting voltage for a level Ln based on the page number received. For example, the memory chip controller may base a calculation of the optimum starting voltage for a level Ln based on $x_p$, that is, based on the number of threshold voltage levels that could correspond to the already received page data according to a Gray code stored within the memory device.

According to this latter embodiment, the prespecified number T or M may be obtained by multiplying the corresponding T or M, respectively, in a non-caching scenario (hereinafter $T_{nc}$ or $M_{nc}$) by $x_p$. Thus, whereas, in a non-caching scenario, $T_{nc}$ or $M_{nc}$ may have been equal to 100, in a caching scenario, according to some embodiments, they may be equal to $100*x_p$. For example, in a TLC memory device, where p=2, $x_p = 2^{(3-2)} = 2$, and if $T_{nc}$ is 100, then T would be 200, meaning that 200 of the cells being programmed at level L2 with a voltage pulse would need to have been counted as having reached a voltage equal to or close to PV2 in order for that voltage pulse used for programmed to be stored as the optimal starting voltage for a PV2 verify for the subsequent programming of memory locations.

It is to be noted that, for the purpose of programming using caching as noted with respect to the third option described in more detail and by way of example in the context of FIG. 11, when a memory chip controller determines that a certain cell voltage level has passed PV1 verify, it does not necessarily mean that the cell is to be ultimately at L1, but rather that it is deemed to be at level L1 with the page data currently received at the memory chip controller until more page data is received, at which point the cell voltage may be increased with additional pulses to a higher level if applicable.

Figure 12:
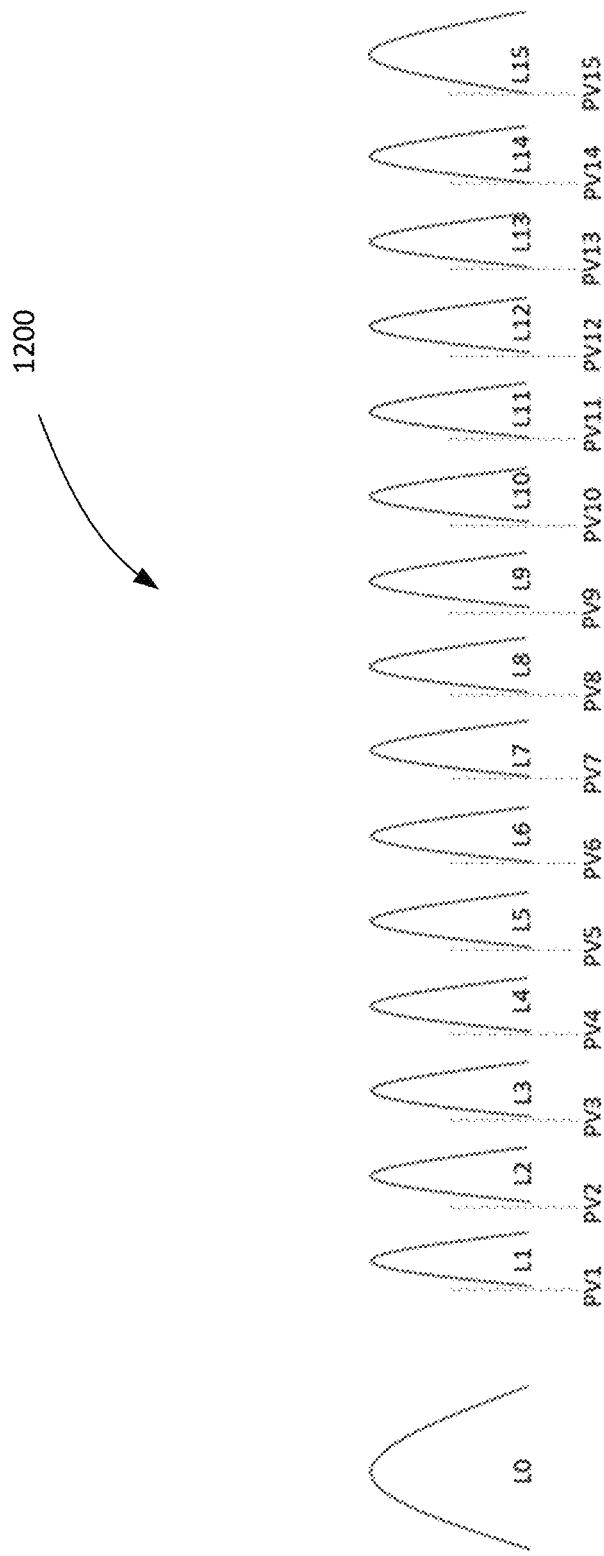
FIG. 12 is a representation of an exemplary threshold voltage distribution similar to that of FIG. 6, but for a NAND cell in a quad level cell (QLC) memory structure.

Although the embodiments of the present invention were explained largely in the context a TLC memory device, embodiments encompass within their scope memory devices with different number of bits per cell. For example, they may be used to cache the data during programming of a four-bit-per-cell also known as quad-level-per-cell (QLC) memory. In a QLC memory four pages of data are provided and cells are programmed into one of the 16 possible threshold voltage levels 1200 as shown in FIG. 12.

Programming of a QLC memory may be performed in two or more passes in order to reduce the interference from programming neighboring wordlines and to achieve tighter placement of the threshold voltage levels when programming two memory locations, with one pass per memory location. For example, programming may be performed in two passes according to a 4-16 algorithm as shown in the possible voltage levels 1300 of FIG. 13. In the first pass 1302, two pages of data are provided, and cells are programmed into one of four possible threshold voltage levels according to the data being programmed into each cell. In the second pass 1304, which may be performed after a wordline is programmed into its first pass, two more pages of data are provided, the two pages that were programmed in the first pass are read from the memory cells, and cells are programmed into one of 16 possible threshold voltage levels.

Figure 13:
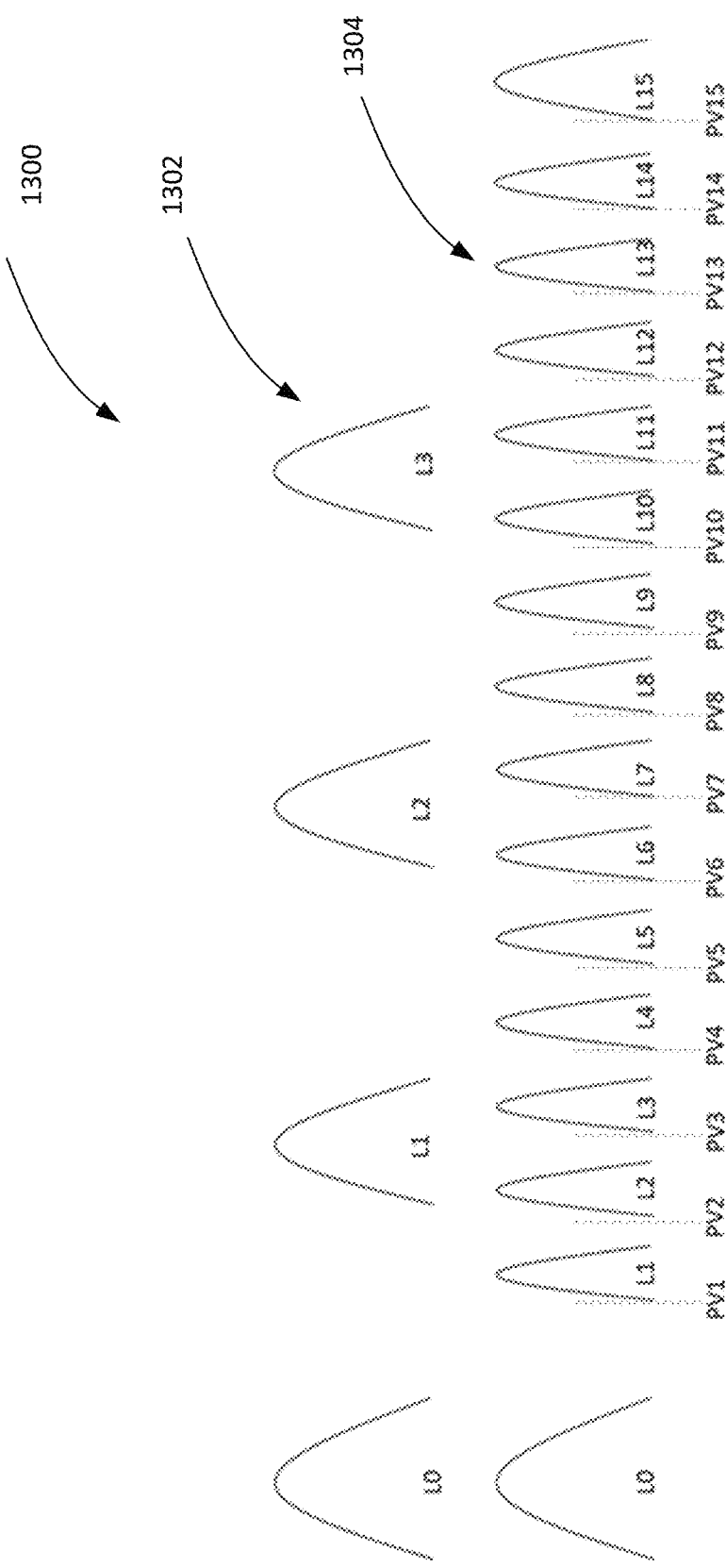
FIG. 13 is a representation of an exemplary threshold voltage distribution similar to that of FIG. 12, and involving a two pass programming regime involving respective passes for respective memory locations.
Figure 14:
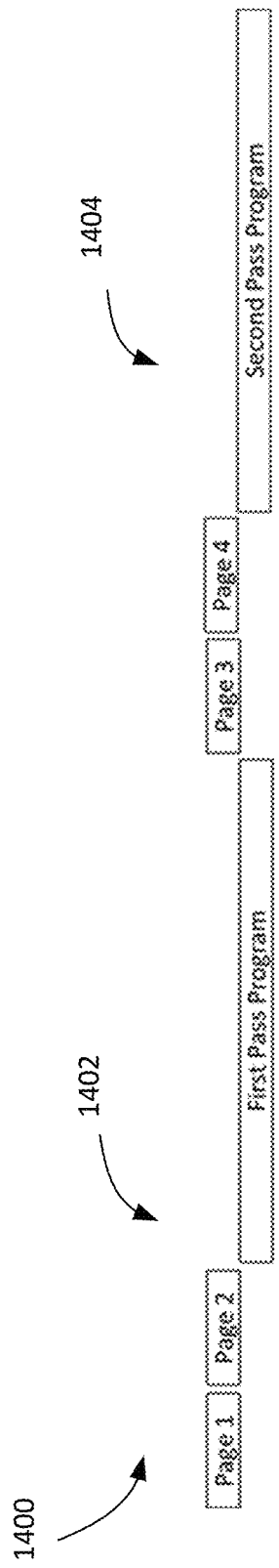
FIG. 14 is a timing diagram similar to those of FIGS. 8-10, but for the NAND cell with a QLC memory structure where a two pass programming regime without caching is used.

FIG. 14 shows a program sequence 1400 for programming a QLC memory according to a 4-16 algorithm of the prior art as described above in connection with FIG. 13. In the first pass 1402, two pages of data, Page 1 and Page 2, may be provided. Once command, address, data, and confirmation for Page 1 and Page 2 is received by the memory chip controller, it may start the first pass programming. Once the memory chip controller has finished implementing the first pass program, it may inform the storage device controller of its status, namely, that it is ready to receive another set of data. The other set of data 1404 may correspond to Page 3 and Page 4 to be programmed in another memory location of the memory device. Once command, address, data and confirmation for Page 3 and Page 4 are received by the memory chip controller, it will start the second pass program operation in the location specified by their address. The memory chip controller may first read the data that was programmed in the first pass at the location of the first pass, and then proceeds to programming cells at the location of the second pass.

Figure 15:
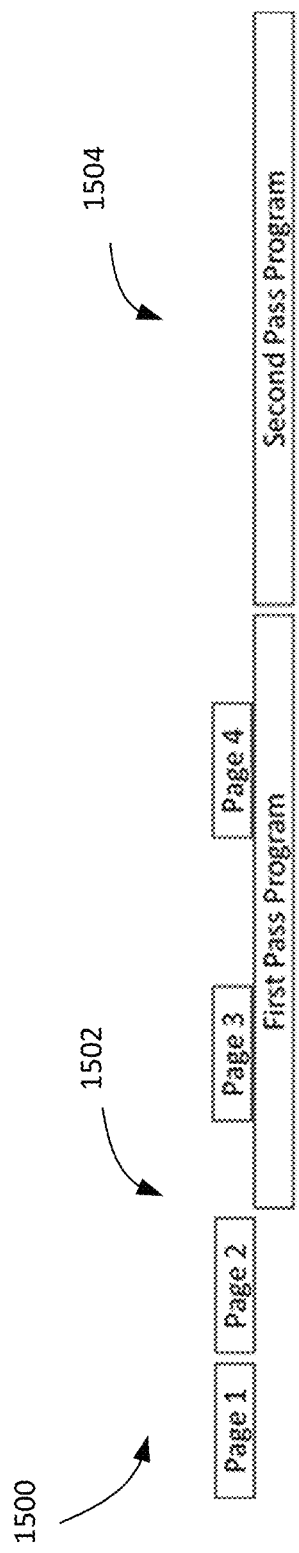
FIG. 15 is a timing diagram similar to FIG. 15, but where caching is used.

In a QLC memory using a two pass programming regime as explained in the context of FIGS. 13 and 14 by way of example, bitline in a QLC memory may be equipped with a given number of latches that is enough to maintain the four pages of data being programmed, as well as to inhibit and for SSPC information. Reference in this context is now made to the program sequence 1500 of FIG. 15. In FIG. 15, during the first pass 1502, each bitline need only maintain two pages of data (Page 1 and Page 2) along with inhibit and SSPC information. Hence, during the first pass 1502, two of the latches are free, and may be used to allow caching of the data (Page 3 and Page 4) for the second pass programming 1504 at the next memory location as shown in FIG. 15.

Figure 16A:
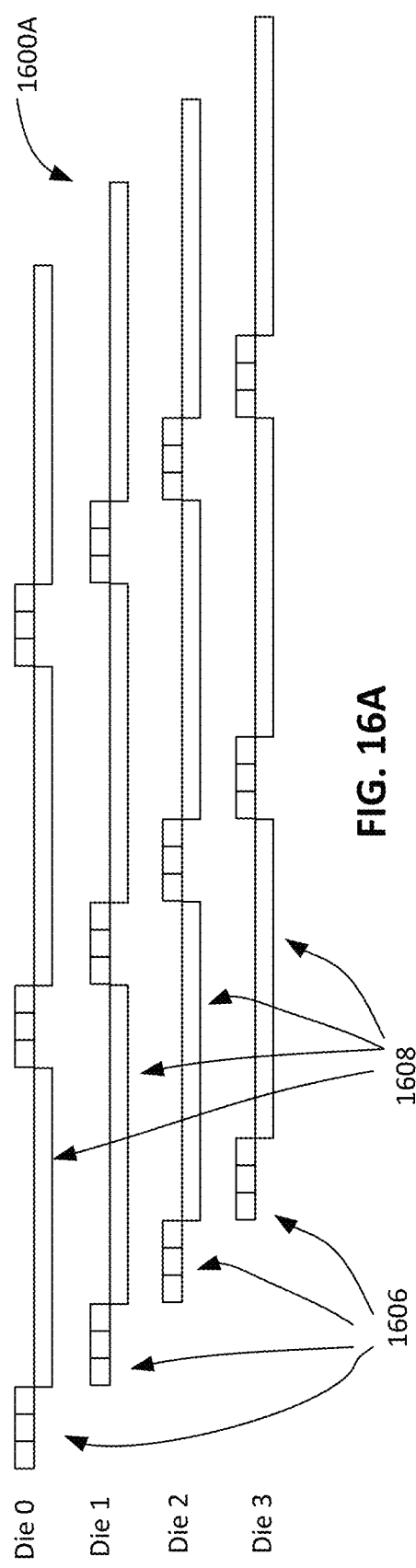
FIG. 16A is a timing diagram without caching for a NAND cell of a TLC memory structure that includes multiple dies sharing a same bus to communicate with a storage device controller of the memory structure.
Figure 16B:
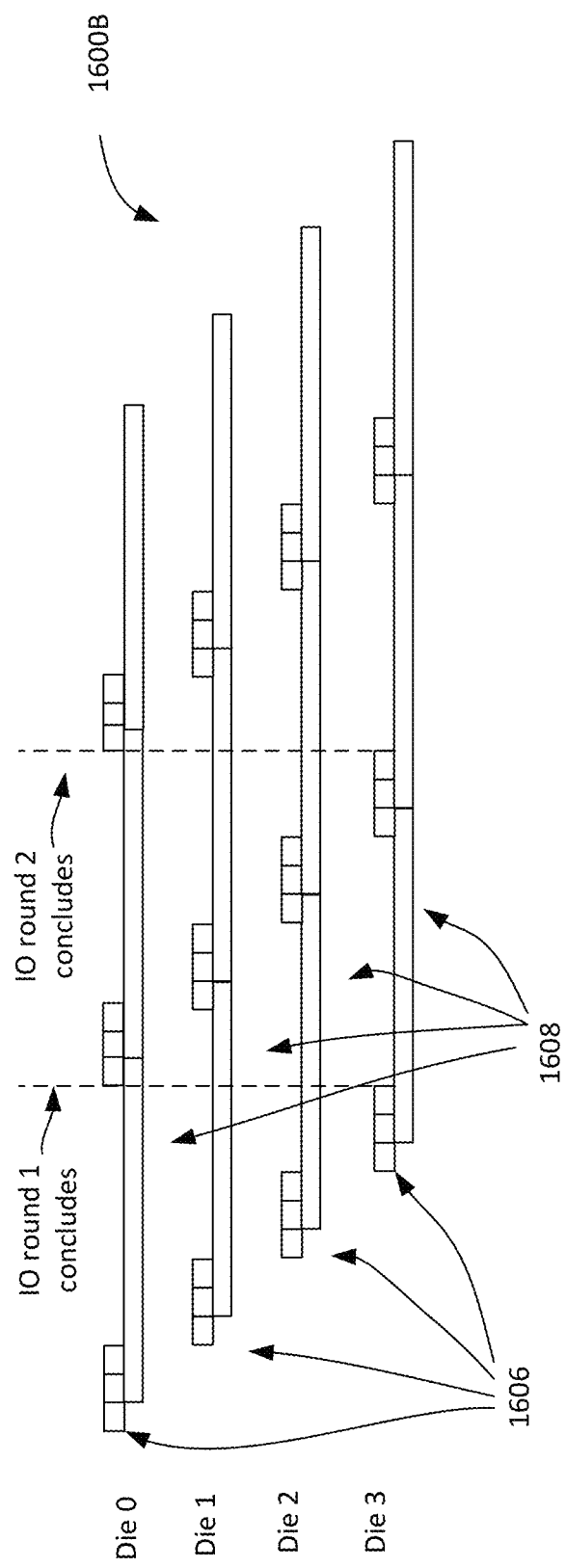
FIG. 16B is a timing diagram similar to FIG. 16A, but with caching.

Referring now to the timing diagram 1600A and 1600B, respectively, of FIGS. 16A and 16B, in some situations, there may be multiple memory dies per communication channel (bus) between a storage device controller, such as storage device controller 118 of FIG. 1, and the memory chip controller controlling the multiple dies. In such a situation, a question arises as to the number of dies beyond which caching may no longer be advantageous. For example, where the multiple memory dies consist of two dies, when the memory chip controller is implementing the program command on die 0, it can perform the IO operation (i.e. receive page data) for die 1 through the common bus between die 0 and die 1, and vice versa. In such a case, caching may not bring a benefit.

Reference is now made to the timing diagram 1600A depicting the plan of record (POR) or current state of the art, and diagram 1600B depicting caching (a fourth option, subsequent to the third option as depicted in FIG. 11). Where four dies are provided in parallel and share a common bus and a common memory chip controller, as long as the memory chip controller controlling them can finish the IO operations prior to finishing a programming of die 0 (see "IO round 1 concludes" and "IO round 2 concludes" as shown by way of broken lines in FIG. 17B), caching may be beneficial to allow IO on die 1 while die 0 is undergoing programming.

Let us refer now to the example POR timing diagram of FIG. 16A, where, with no caching, for three pages of data, and three programming repetitions R per die (e.g. where three memory locations of the device are to be programmed), the IO operation including TIOs 1606 for the three pages for each repetition concludes prior to the conclusion of TPROG 1608 pertaining to the programming of die 0 for that same repetition. In any given repetition 1 or 2, if the IO operation all of dies 0, 1, 2 and 3 in timing diagram 1600A were to finish after TPROG for die 0 in that same repetition, then, the bus would not be able to begin receiving IO for die 0 until IO for the last die, die 3, has been completed, in which case, the memory chip controller would be idle between the time when the TPROG for die 0 ends and the time when the IO for die 3 ends before it can be ready to receive page data for die 0 again for the next repetitio. This would add latency to the operation. Moreover, in the same manner, even where, in any given repetition 1 or 2, the IO operation of all of dies 0, 1, 2 and 3 were to finish before TPROG for die 0 in that same repetition, still, if the number of dies is increased beyond 4, because more time would be needed to conclude the IO operation for all dies (to receive page data for more dies in the same bus), by the time the memory chip controller finishes programming die 0, it may not have finished receiving data for the remaining dies. In such a case, again, if a memory chip controller programming of a previous die is finished before data is received for a subsequent die, the memory chip controller may need to remain idle until the storage device controller sends the page data for all dies before the memory chip controller can start programming again. A question therefore arises as to the point at which one may still see a benefit from caching of page data during programming of a memory location.

In the POR timing diagram 1600A of FIG. 16A, there are three pages of data at 1606, four dies (dies 0-3), and three repetitions R, with each repetition per die including an IO operation 1606 receive the three pages of data and a programming operation 1608 per die. In such a case, the total programming time for all four dies would be given by:

Total time=(3*TIO+TPROG)*R+(3*3*TIO),   Eq. (1)

and the effective programming time per page would be given by:

Eff TPROG PER PAGE=(TIO+TPROG/3)/4+(3/4*TIO/R)≈(TIO+TPROG/3)/# of dies.   Eq. (2)

Referring now to the timing diagram 1600B in the fourth option of FIG. 16B where caching occurs:

Total time=(TPROG)*R+(3*3*TIO),   Eq. (3)

and the effective programming time per page would be given by:

Eff TPROG PER PAGE≈(TPROG/3)/4+3/4*TIO/3 # of dies≈(TPROG/3)/# of dies   Eq. (4)

Equation (4) above is an indication that caching in the 4 die scenario of FIG. 16B works with R=3 and number of pages=3, where the effective programming time per die is shortened as between no caching (POR) and caching (option 4).

Where the memory device is a large device, such as a large solid state device with multiple dies where clusters of the dies share a same bus to a same memory chip controller, and where the memory device is further power limited, there could be no benefit to performing caching for the reasons described above.

Typically, for one repetition:

the total IO time=the number of dies sharing a bus*IO operation time per die   Eq. (5)

In order for caching to be beneficial, the total IO time ought to be smaller than or equal to TPROG (1608 in FIGS. 16A/16B). The beneficial result of having a TPROG (per repetition) that is larger than equal to the number of dies times the IO operation time per die is clearly shown in FIG. 16B, where the total IO time can conclude (see "IO round 1 concludes" and "IO round 2 concludes" in FIG. 17B) during TPROG of die 0 so that the shared bus can, at or after the conclusion of the total IO time of one round, begin receiving new page data and caching it for the next round (or next iteration).

According to some embodiments, a memory chip controller may be configured to determine whether to cache based on a determination as set forth in Equation (5) above. Additionally, according to some embodiments, a memory chip controller may further determine whether to cache based on the amount of power available to the memory chip controller for performing further operations.

FIG. 17 illustrates an example of a process 1700 to be performed at a processing circuitry of a flash memory device according to some embodiments. The process includes, at operation 1702, receiving data for a first page of N pages of data, at operation 1704, programming memory cells of a memory location of the device to an nth threshold voltage level Ln, Ln corresponding to a program verify voltage level PVn, n being an integer from 0 to $2^N-1$, and Ln being one of $2^N$ threshold voltage levels achievable using the N pages of data. Programming the cells at operation 1704 includes, at operation 1704*a*, programming the cells based on the data for the first page while receiving data for subsequent pages of the N pages; and at operation 1704*b*, programming the cells based on the data for the subsequent pages, wherein programming the cells includes, for at least n=1, causing a respective dynamic start voltage (DSV) to be applied to the cells based on each respective page number p of the N pages for which data is received at the memory chip controller for the memory location to achieve PV1.

The flow described in FIG. 17 is merely representative of operations that may occur in particular embodiments. In other embodiments, additional operations may be performed by the components of system 100. Various embodiments of the present disclosure contemplate any suitable mechanisms for accomplishing the functions described herein. Some of the operations illustrated in FIG. 17 may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components such as CPU 102, external I/O controller 104, processor 108, cores 114A and 114B, I/O controller 110, CPU memory controller 112, storage device 106, system memory device 107, memory 116, memory devices 122, memory chips 123, memory chip controllers 126, storage device controller 118, address translation engine 120, program control logic 124, memory array 200, a page buffer, subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Examples of Some Embodiments are Provided Below.

Example 1 includes a memory chip controller of a flash memory device, the memory chip controller including processing circuitry to: receive data for a first page of N pages of data; and program cells of a memory location of the device to an nth threshold voltage level $L_n$, $L_n$ corresponding to a program verify voltage level $PV_n$, n being an integer from 0 to $2^N-1$, and $L_n$ being one of $2^N$ threshold voltage levels achievable using the N pages of data, programming the cells including: programming the cells based on the data for the first page while receiving data for subsequent pages of the N pages; and programming the cells based on the data for the subsequent pages, wherein programming the cells includes, for at least n=1, causing a respective dynamic start voltage (DSV) to be applied to the cells based on each respective page number p of the N pages for which data is received at the memory chip controller for the memory location to achieve $PV_1$.

Example 2 includes the subject matter of Example 1, the processing circuitry further to calculate each respective DSV based on each respective page number p of N pages prior to programming the cells.

Example 3 includes the subject matter of Example 2, wherein calculating each respective DSV includes: applying a pulse voltage to at least some of the cells; sampling $1/2^{(N-p)}$ fraction of said at least some of the cells for $PV_n$ verify; in response to a determination that a number of sampled cells that pass $PV_n$ verify is equal to or above a pre-specified threshold integer T, setting said each respective DSV to be equal to said pulse voltage; and using said each respective DSV based on received page number p for subsequent programming operations.

Example 4 includes the subject matter of Example 2, wherein calculating each respective DSV includes: applying a pulse voltage to at least some of the cells; in response to a determination that a number of sampled cells that pass $PV_n$ verify is equal to $2^{(N-p)}*M$, wherein M is a pre-specified integer number of cells, setting said each respective DSV to be equal to said pulse voltage; and using said each respective DSV based on received page number p for subsequent programming operations.

Example 5 includes the subject matter of Example 1, wherein the memory chip controller is to: compare data bit values for received ones of the N pages of data against a Gray code table, the Gray code table including distinct sets of bit values respectively representing distinct threshold voltage levels $L_n$ for all possible integer values of n from 0 to $2^N$; and determine, based on comparing against the Gray code table, for data received for each page p that is between 1 and N−1, whether the cells are to be at a threshold voltage level that is one of at $L_{p-1}$, or above $L_{p-1}$.

Example 6 includes the subject matter of Example 1, wherein the memory location is a first memory location, the processing circuitry further to program the cells of the first memory location while receiving data for one or more pages of N pages to be programmed in cells of a second memory location different from the first memory location.

Example 7 includes the subject matter of Example 6, the processing circuitry to further store, in one or more bitline latches corresponding to each page to be programmed, the data for the subsequent pages for the first memory location, and the data for the one or more pages for the second memory location.

Example 8 includes the subject matter of Example 7, the one or more bitline latches includes a selected slow program convergence (SSPC) latch adapted to indicate whether a bitline is to receive a SSPC voltage during programming, wherein the processing circuitry is to determine to use the SSPC latch to store data for a page of the one or more pages to be programmed in the cells of the second memory location.

Example 9 includes the subject matter of Example 8, wherein the processing circuitry is to determine to use the SSPC latch to store data for a page of the one or more pages to be programmed in the cells of the second memory location after a determination that the cells of the memory location are at a next to highest threshold voltage level possible based on the N pages of data.

Example 10 includes the subject matter of Example 1, wherein the processing circuitry is to allocate a plurality of bitline latches for a bitline corresponding to the memory location, the bitline latches to store, respectively, data for the first page, data for each of the subsequent pages, and information to indicate whether the cells of the memory location are to be inhibited from further programming based on data for the N pages.

Example 11 includes the subject matter of Example 1, wherein data for the N pages is from a storage device controller of the flash memory device, the processing circuitry adapted to send its status information to the storage device controller, including information on whether or not it is programming.

Example 12 includes the subject matter of Example 11, wherein the status information includes information on at least one of whether the memory chip controller is: programming based on the data for page number p, and further ready to receive further data on page p+1; and idle and further ready to receive further data.

Example 13 includes the subject matter of Example 12, wherein the status information includes information on at least one of whether the memory chip controller is at least one of: programming and all N pages for ongoing programming have been received, and either ready or not ready to receive a next set of N pages of data; programming and not ready to receive further data; or idle and not ready to receive further data.

Example 14 includes the subject matter of Example 1, wherein data for the N pages is from a storage device controller of the flash memory device, the processing circuitry is further to: receive power status information regarding the storage device controller, and in response to a determination that the power status information indicates a low power status, program the cells using an energy storage device other than one supplying power to the storage device controller.

Example 15 includes the subject matter of Example 1, wherein data for the N pages is from a storage device controller of the flash memory device, the processing circuitry is further to: receive power status information regarding the storage device controller, and in response to a determination that the power status information indicates a low power status, switch to a low latency mode to program the data.

Example 16 includes the subject matter of Example 1, wherein the processing circuitry is adapted to: program a plurality of memory dies and to receive page data for the dies through a shared bus for the dies; and determine, for a round of programming, whether to program the cells while receiving further data based on a determination that, for the round of programming, receiving page data for all dies is to conclude prior to a conclusion of programming for a first die of the dies.

Example 17 includes a flash memory device including: a plurality of memory dies; a storage device controller; one or more memory chip controllers coupled between the storage device controller and the plurality of memory dies to program the memory dies, each memory chip controller including processing circuitry to: receive, from the storage device controller, data for a first page of N pages of data; and program cells of a memory location of the device to an nth threshold voltage level Ln, Ln corresponding to a program verify voltage level PVn, n being an integer from 0 to $2^N-1$, and Ln being one of $2^N$ threshold voltage levels achievable using the N pages of data, programming the cells including: programming the cells based on the data for the first page while receiving data for subsequent pages of the N pages; and programming the cells based on the data for the subsequent pages, wherein programming the cells includes, for at least n=1, causing a respective dynamic start voltage (DSV) to be applied to the cells based on each respective page number p of the N pages for which data is received at said each memory chip controller for the memory location to achieve PV1.

Example 18 includes the subject matter of Example 17, the processing circuitry further to calculate each respective DSV based on each respective page number p of N pages prior to programming the cells.

Example 19 includes the subject matter of Example 18, wherein calculating each respective DSV includes: applying a pulse voltage to at least some of the cells; sampling $1/2^{(N-p)}$ fraction of said at least some of the cells for PVn verify; in response to a determination that a number of sampled cells that pass PVn verify is equal to or above a pre-specified threshold integer T, setting said each respective DSV to be equal to said pulse voltage; and using said each respective DSV based on received page number p for subsequent programming operations.

Example 20 includes the subject matter of Example 18, wherein calculating each respective DSV includes: applying a pulse voltage to at least some of the cells; in response to a determination that a number of sampled cells that pass PVn verify is equal to $2^{(N-p)}*M$, wherein M is a pre-specified integer number of cells, setting said each respective DSV to be equal to said pulse voltage; and using said each respective DSV based on received page number p for subsequent programming operations.

Example 21 includes the subject matter of Example 17, wherein said each memory chip controller is to: compare data bit values for received ones of the N pages of data against a Gray code table, the Gray code table including distinct sets of bit values respectively representing distinct threshold voltage levels Ln for all possible integer values of n from 0 to $2^N$; and determine, based on comparing against the Gray code table, for data received for each page p that is between 1 and N-1, whether the cells are to be at a threshold voltage level that is one of at Lp-1, or above Lp-1.

Example 22 includes the subject matter of Example 17, wherein the memory location is a first memory location, the processing circuitry further to program the cells of the first memory location while receiving data for one or more pages of N pages to be programmed in cells of a second memory location different from the first memory location.

Example 23 includes the subject matter of Example 22, the processing circuitry to further store, in one or more bitline latches corresponding to each page to be programmed, the data for the subsequent pages for the first memory location, and the data for the one or more pages for the second memory location.

Example 24 includes the subject matter of Example 23, the one or more bitline latches include a selected slow program convergence (SSPC) latch adapted to indicate whether a bitline is to receive a SSPC voltage during programming, wherein the processing circuitry is to determine to use the SSPC latch to store data for a page of the one or more pages to be programmed in the cells of the second memory location.

Example 25 includes the subject matter of Example 24, wherein the processing circuitry is to determine to use the SSPC latch to store data for a page of the one or more pages to be programmed in the cells of the second memory location after a determination that the cells of the memory location are at a next to highest threshold voltage level possible based on the N pages of data.

Example 26 includes the subject matter of Example 17, wherein the processing circuitry is to allocate a plurality of bitline latches for a bitline corresponding to the memory location, the bitline latches to store, respectively, data for the first page, data for each of the subsequent pages, and information to indicate whether the cells of the memory location are to be inhibited from further programming based on data for the N pages.

Example 27 includes the subject matter of Example 17, the processing circuitry adapted to send its status information to the storage device controller, including information on whether or not it is programming.

Example 28 includes the subject matter of Example 27, wherein the status information includes information on at least one of whether said each memory chip controller is: programming based on the data for page number p, and further ready to receive further data on page p+1; and idle and further ready to receive further data.

Example 29 includes the subject matter of Example 28, wherein the status information includes information on at least one of whether said each memory chip controller is at least one of: programming and all N pages for ongoing programming have been received, and either ready or not ready to receive a next set of N pages of data; programming and not ready to receive further data; or idle and not ready to receive further data.

Example 30 includes the subject matter of Example 17, wherein the processing circuitry is further to: receive power status information regarding the storage device controller, and in response to a determination that the power status information indicates a low power status, program the cells using an energy storage device other than one supplying power to the storage device controller.

Example 31 includes the subject matter of Example 17, wherein the processing circuitry is further to: receive power status information regarding the storage device controller, and in response to a determination that the power status information indicates a low power status, switch to a low latency mode to program the data.

Example 32 includes the subject matter of Example 17, wherein the processing circuitry is adapted to: program a plurality of memory dies and to receive page data for the dies through a shared bus for the dies; and determine, for a round of programming, whether to program the cells while receiving further data based on a determination that, for the round of programming, receiving page data for all dies is to conclude prior to a conclusion of programming for a first die of the dies.

Example 33 includes a method to be performed at a memory chip controller of a flash memory device comprising: receiving data for a first page of N pages of data; and programming cells of a memory location of the device to an nth threshold voltage level Ln, Ln corresponding to a program verify voltage level PVn, n being an integer from 0 to $2^N-1$, and Ln being one of $2^N$ threshold voltage levels achievable using the N pages of data, programming the cells including: programming the cells based on the data for the first page while receiving data for subsequent pages of the N pages; and programming the cells based on the data for the subsequent pages, wherein programming the cells includes, for at least n=1, causing a respective dynamic start voltage (DSV) to be applied to the cells based on each respective page number p of the N pages for which data is received at the memory chip controller for the memory location to achieve PV1.

Example 34 includes the subject matter of Example 33, further including calculating each respective DSV based on each respective page number p of N pages prior to programming the cells.

Example 35 includes the subject matter of Example 34, wherein calculating each respective DSV includes: applying a pulse voltage to at least some of the cells; sampling $1/2^{(N-p)}$ fraction of said at least some of the cells for PVn verify; in response to a determination that a number of sampled cells that pass PVn verify is equal to or above a pre-specified threshold integer T, setting said each respective DSV to be equal to said pulse voltage; and using said each respective DSV based on received page number p for subsequent programming operations.

Example 36 includes the subject matter of Example 34, wherein calculating each respective DSV includes: applying a pulse voltage to at least some of the cells; in response to a determination that a number of sampled cells that pass PVn verify is equal to $2^{(N-p)}*M$, wherein M is a pre-specified integer number of cells, setting said each respective DSV to be equal to said pulse voltage; and using said each respective DSV based on received page number p for subsequent programming operations.

Example 37 includes the subject matter of Example 33, further including: comparing data bit values for received ones of the N pages of data against a Gray code table, the Gray code table including distinct sets of bit values respectively representing distinct threshold voltage levels Ln for all possible integer values of n from 0 to $2^N$; and determining, based on comparing against the Gray code table, for data received for each page p that is between 1 and N−1, whether the cells are to be at a threshold voltage level that is one of at Lp−1, or above Lp−1.

Example 38 includes the subject matter of Example 33, wherein the memory location is a first memory location, further including programming the cells of the first memory location while receiving data for one or more pages of N pages to be programmed in cells of a second memory location different from the first memory location.

Example 39 includes the subject matter of Example 38, further including storing, in one or more bitline latches corresponding to each page to be programmed, the data for the subsequent pages for the first memory location, and the data for the one or more pages for the second memory location.

Example 40 includes the subject matter of Example 39, the one or more bitline latches includes a selected slow program convergence (SSPC) latch adapted to indicate whether a bitline is to receive a SSPC voltage during programming, the method further including determining to use the SSPC latch to store data for a page of the one or more pages to be programmed in the cells of the second memory location.

Example 41 includes the subject matter of Example 40, further including determining to use the SSPC latch to store data for a page of the one or more pages to be programmed in the cells of the second memory location after a determination that the cells of the memory location are at a next to highest threshold voltage level possible based on the N pages of data.

Example 42 includes the subject matter of Example 33, further including allocating a plurality of bitline latches for a bitline corresponding to the memory location, the bitline latches to store, respectively, data for the first page, data for each of the subsequent pages, and information to indicate whether the cells of the memory location are to be inhibited from further programming based on data for the N pages.

Example 43 includes the subject matter of Example 33, wherein data for the N pages is from a storage device controller of the flash memory device, the method further including sending its status information to the storage device controller, including information on whether or not it is programming.

Example 44 includes the subject matter of Example 43, wherein the status information includes information on at least one of whether the memory chip controller is: programming based on the data for page number p, and further ready to receive further data on page p+1; and idle and further ready to receive further data.

Example 45 includes the subject matter of Example 44, wherein the status information includes information on at least one of whether the memory chip controller is at least one of: programming and all N pages for ongoing programming have been received, and either ready or not ready to receive a next set of N pages of data; programming and not ready to receive further data; or idle and not ready to receive further data.

Example 46 includes the subject matter of Example 33, wherein data for the N pages is from a storage device controller of the flash memory device, the method further including: receiving power status information regarding the storage device controller, and in response to a determination that the power status information indicates a low power status, programming the cells using an energy storage device other than one supplying power to the storage device controller.

Example 47 includes the subject matter of Example 33, wherein data for the N pages is from a storage device controller of the flash memory device, the method further including: receiving power status information regarding the storage device controller, and in response to a determination that the power status information indicates a low power status, switching to a low latency mode to program the data.

Example 48 includes the subject matter of Example 33, further including: programming a plurality of memory dies and receiving page data for the dies through a shared bus for the dies; and determining, for a round of programming, whether to program the cells while receiving further data based on a determination that, for the round of programming, receiving page data for all dies is to conclude prior to a conclusion of programming for a first die of the dies.

Example 49 includes a non-transitory machine readable storage medium having instructions stored thereon, the instructions, when executed by a memory chip controller of a flash memory device, to cause the memory chip controller: receive data for a first page of N pages of data; and program cells of a memory location of the device to an nth threshold voltage level Ln, Ln corresponding to a program verify voltage level PVn, n being an integer from 0 to $2^N-1$, and Ln being one of $2^N$ threshold voltage levels achievable using the N pages of data, programming the cells including: programming the cells based on the data for the first page while receiving data for subsequent pages of the N pages; and programming the cells based on the data for the subsequent pages, wherein programming the cells includes, for at least n=1, causing a respective dynamic start voltage (DSV) to be applied to the cells based on each respective page number p of the N pages for which data is received at the memory chip controller for the memory location to achieve PV1.

Example 50 includes the subject matter of Example 49, the instructions to further cause the memory chip controller to calculate respective DSV based on each respective page number p of N pages prior to programming the cells.

Example 51 includes the subject matter of Example 50, wherein calculating each respective DSV includes: applying a pulse voltage to at least some of the cells; sampling $1/2^{(N-p)}$ fraction of said at least some of the cells for PVn verify; in response to a determination that a number of sampled cells that pass PVn verify is equal to or above a pre-specified threshold integer T, setting said each respective DSV to be equal to said pulse voltage; and using said each respective DSV based on received page number p for subsequent programming operations.

Example 52 includes the subject matter of Example 50, wherein calculating each respective DSV includes: applying a pulse voltage to at least some of the cells; in response to a determination that a number of sampled cells that pass PVn verify is equal to $2^{(N-p)}*M$, wherein M is a pre-specified integer number of cells, setting said each respective DSV to be equal to said pulse voltage; and using said each respective DSV based on received page number p for subsequent programming operations.

Example 53 includes the subject matter of Example 49, the instructions to further cause the memory chip controller to: compare data bit values for received ones of the N pages of data against a Gray code table, the Gray code table including distinct sets of bit values respectively representing distinct threshold voltage levels Ln for all possible integer values of n from 0 to $2^N$; and determine, based on comparing against the Gray code table, for data received for each page p that is between 1 and N-1, whether the cells are to be at a threshold voltage level that is one of at Lp-1, or above Lp-1.

Example 54 includes the subject matter of Example 49, wherein the memory location is a first memory location, the instructions to further cause the memory chip controller to program the cells of the first memory location while receiving data for one or more pages of N pages to be programmed in cells of a second memory location different from the first memory location.

Example 55 includes the subject matter of Example 54, the instructions to further cause the memory chip controller to store, in one or more bitline latches corresponding to each page to be programmed, the data for the subsequent pages for the first memory location, and the data for the one or more pages for the second memory location.

Example 56 includes the subject matter of Example 55, the one or more bitline latches includes a selected slow program convergence (SSPC) latch adapted to indicate whether a bitline is to receive a SSPC voltage during programming, the instructions to further cause the memory chip controller to determine to use the SSPC latch to store data for a page of the one or more pages to be programmed in the cells of the second memory location.

Example 57 includes the subject matter of Example 56, the instructions to further cause the memory chip controller to determine to use the SSPC latch to store data for a page of the one or more pages to be programmed in the cells of the second memory location after a determination that the cells of the memory location are at a next to highest threshold voltage level possible based on the N pages of data.

Example 58 includes the subject matter of Example 49, the instructions to further cause the memory chip controller to allocate a plurality of bitline latches for a bitline corresponding to the memory location, the bitline latches to store, respectively, data for the first page, data for each of the subsequent pages, and information to indicate whether the cells of the memory location are to be inhibited from further programming based on data for the N pages.

Example 59 includes the subject matter of Example 49, wherein data for the N pages is from a storage device controller of the flash memory device, the instructions to further cause the memory chip controller to send its status information to the storage device controller, including information on whether or not it is programming.

Example 60 includes the subject matter of Example 59, wherein the status information includes information on at least one of whether the memory chip controller is: programming based on the data for page number p, and further ready to receive further data on page p+1; and idle and further ready to receive further data.

Example 61 includes the subject matter of Example 60, wherein the status information includes information on at least one of whether the memory chip controller is at least one of: programming and all N pages for ongoing programming have been received, and either ready or not ready to receive a next set of N pages of data; programming and not ready to receive further data; or idle and not ready to receive further data.

Example 62 includes the subject matter of Example 49, wherein data for the N pages is from a storage device controller of the flash memory device, the instructions to further cause the memory chip controller to: receive power status information regarding the storage device controller, and in response to a determination that the power status information indicates a low power status, program the cells using an energy storage device other than one supplying power to the storage device controller.

Example 63 includes the subject matter of Example 49, the instructions to further cause the memory chip controller to: receive power status information regarding the storage device controller, and in response to a determination that the power status information indicates a low power status, switch to a low latency mode to program the data.

Example 64 includes the subject matter of Example 49, the instructions to further cause the memory chip controller to: program a plurality of memory dies and to receive page data for the dies through a shared bus for the dies; and determine, for a round of programming, whether to program the cells while receiving further data based on a determination that, for the round of programming, receiving page data for all dies is to conclude prior to a conclusion of programming for a first die of the dies.

Example 65 includes an integrated circuit of a flash memory device comprising: means for receiving data for a first page of N pages of data; and means for programming cells of a memory location of the device to an nth threshold voltage level Ln, Ln corresponding to a program verify voltage level PVn, n being an integer from 0 to $2^N-1$, and Ln being one of $2^N$ threshold voltage levels achievable using the N pages of data, the means for programming the cells including: means for programming the cells based on the data for the first page while receiving data for subsequent pages of the N pages; and means for programming the cells based on the data for the subsequent pages, wherein programming the cells includes, for at least n=1, causing a respective dynamic start voltage (DSV) to be applied to the cells based on each respective page number p of the N pages for which data is received at the integrated circuit for the memory location to achieve PV1.

Example 66 includes the subject matter of Example 65, further including means for calculating each respective DSV based on each respective page number p of N pages prior to programming the cells.

Example 67 includes the subject matter of Example 66, wherein the means for calculating each respective DSV includes: means for applying a pulse voltage to at least some of the cells; means for sampling $1/2^{(N-p)}$ fraction of said at least some of the cells for PVn verify; means for, in response to a determination that a number of sampled cells that pass PVn verify is equal to or above a pre-specified threshold integer T, setting said each respective DSV to be equal to said pulse voltage; and means for using said each respective DSV based on received page number p for subsequent programming operations.

Example 68 includes the subject matter of Example 66, wherein the means for calculating each respective DSV includes: means for applying a pulse voltage to at least some of the cells; means for, in response to a determination that a number of sampled cells that pass PVn verify is equal to $2^{(N-p)}*M$, wherein M is a pre-specified integer number of cells, setting said each respective DSV to be equal to said pulse voltage; and means for using said each respective DSV based on received page number p for subsequent programming operations.

Example 69 includes the subject matter of Example 65, further including: means for comparing data bit values for received ones of the N pages of data against a Gray code table, the Gray code table including distinct sets of bit values respectively representing distinct threshold voltage levels Ln for all possible integer values of n from 0 to $2^N$; and means for determining, based on comparing against the Gray code table, for data received for each page p that is between 1 and N-1, whether the cells are to be at a threshold voltage level that is one of at Lp-1, or above Lp-1.

Example 70 includes the subject matter of Example 65, wherein the memory location is a first memory location, further including means for programming the cells of the first memory location while receiving data for one or more pages of N pages to be programmed in cells of a second memory location different from the first memory location.

Example 71 includes the subject matter of Example 70, further including means for storing, in one or more bitline latches corresponding to each page to be programmed, the data for the subsequent pages for the first memory location, and the data for the one or more pages for the second memory location.

Example 72 includes the subject matter of Example 71, the one or more bitline latches includes a selected slow program convergence (SSPC) latch adapted to indicate whether a bitline is to receive a SSPC voltage during programming, the integrated circuit further including means for determining to use the SSPC latch to store data for a page of the one or more pages to be programmed in the cells of the second memory location.

Example 73 includes the subject matter of Example 72, further including means for determining to use the SSPC latch to store data for a page of the one or more pages to be programmed in the cells of the second memory location after a determination that the cells of the memory location are at a next to highest threshold voltage level possible based on the N pages of data.

Example 74 includes the subject matter of Example 65, further including means for allocating a plurality of bitline latches for a bitline corresponding to the memory location, the bitline latches to store, respectively, data for the first page, data for each of the subsequent pages, and information to indicate whether the cells of the memory location are to be inhibited from further programming based on data for the N pages.

Example 75 includes the subject matter of Example 65, wherein data for the N pages is from a storage device controller of the flash memory device, the integrated circuit further including means for sending its status information to the storage device controller, including information on whether or not it is programming.

Example 76 includes the subject matter of Example 75, wherein the status information includes information on at least one of whether the integrated circuit is: programming based on the data for page number p, and further ready to receive further data on page p+1; and idle and further ready to receive further data.

Example 77 includes the subject matter of Example 76, wherein the status information includes information on at least one of whether the integrated circuit is at least one of: programming and all N pages for ongoing programming have been received, and either ready or not ready to receive a next set of N pages of data; programming and not ready to receive further data; or idle and not ready to receive further data.

Example 78 includes the subject matter of Example 65, wherein data for the N pages is from a storage device controller of the flash memory device, the integrated circuit further including: means for receiving power status information regarding the storage device controller, and means for, in response to a determination that the power status information indicates a low power status, programming the cells using an energy storage device other than one supplying power to the storage device controller.

Example 79 includes the subject matter of Example 65, wherein data for the N pages is from a storage device controller of the flash memory device, the integrated circuit further including: means for receiving power status information regarding the storage device controller, and means for, in response to a determination that the power status information indicates a low power status, switching to a low latency mode to program the data.

Example 80 includes the subject matter of Example 65, further including: means for programming a plurality of memory dies and receiving page data for the dies through a shared bus for the dies; and means for determining, for a round of programming, whether to program the cells while receiving further data based on a determination that, for the round of programming, receiving page data for all dies is to conclude prior to a conclusion of programming for a first die of the dies.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A memory chip controller of a flash memory device, the memory chip controller including processing circuitry to:
   receive data for a first page of N pages of data;
   receive data for subsequent pages of the N pages of data;
   for a page number p of the N pages, and for cells of a memory location of the device, wherein the cells are to be programmed to a nth threshold voltage level Ln, Ln associated with a program verify voltage level PVn:
       apply a pulse voltage to at least some of the cells;
       sample a fraction of said at least some of the cells for PVn verify:
       in response to a determination that a number of sampled cells that pass PVn verify is equal to or above a pre-specified threshold, determine a dynamic start voltage (DSV) to be equal to said pulse voltage; and
   program the cells of the memory location of the device to the nth threshold voltage level Ln including:
       programming the cells based on the data for the first page while receiving the data for subsequent pages of the N pages; and
       programming the cells based on the data for the subsequent pages, wherein programming the cells further includes, for at least n=1 and for the page number p, causing the DSV to be applied to the cells.

2. The memory chip controller of claim 1, the processing circuitry further to determine respective DSVs based on respective pages of the N pages prior to programming the cells.

3. The memory chip controller of claim 1, wherein the fraction corresponds to $1/2^{(N-p)}$.

4. The memory chip controller of claim 1, wherein the predefined threshold is equal to $2^{(N-p)}*M$, wherein M is a pre-specified integer number of cells.

5. The memory chip controller of claim 1, wherein the memory location is a first memory location, the processing circuitry further to:
   program the cells of the first memory location while receiving data for one or more pages of N pages to be programmed in cells of a second memory location different from the first memory location; and
   store, in one or more bitline latches corresponding to each page to be programmed, the data for the subsequent pages for the first memory location, and the data for the one or more pages for the second memory location.

6. The memory chip controller of claim 5, wherein the one or more bitline latches includes a selected slow program convergence (SSPC) latch adapted to indicate whether a bitline is to receive a SSPC voltage during programming, and wherein the processing circuitry is to determine to use the SSPC latch to store data for a page of the one or more pages to be programmed in the cells of the second memory location after a determination that the cells of the memory location are at a next to highest threshold voltage level possible based on the N pages of data.

7. The memory chip controller of claim 1, wherein data for the N pages is from a storage device controller of the flash memory device, the processing circuitry adapted to send its status information to the storage device controller, including information on whether or not it is programming.

8. The memory chip controller of claim 7, wherein the status information includes information on at least one of whether the memory chip controller is:

programming based on the data for page number p, and further ready to receive further data on page p+1; and idle and further ready to receive further data.

9. The memory chip controller of claim 1, wherein data for the N pages is from a storage device controller of the flash memory device, the processing circuitry is further to:
receive power status information regarding the storage device controller, and
in response to a determination that the power status information indicates a low power status, at least one of program the cells using an energy storage device other than one supplying power to the storage device controller, or switch to a low latency mode to program the data.

10. The memory chip controller of claim 1, wherein the processing circuitry is adapted to:
program a plurality of memory dies and to receive page data for the dies through a shared bus for the dies; and
determine, for a round of programming, whether to program the cells while receiving further data based on a determination that, for the round of programming, receiving page data for all dies is to conclude prior to a conclusion of programming for a first die of the dies.

11. A flash memory device including:
a plurality of memory dies;
a storage device controller;
one or more memory chip controllers coupled between the storage device controller and the plurality of memory dies to program the memory dies, each memory chip controller including processing circuitry to:
receive, from the storage device controller, data for a first page of N pages of data;
receive data for subsequent pages of the N pages of data;
for each page number p of the N pages, and for cells of a memory location of the device, wherein the cells are to be programmed to a nth threshold voltage level Ln, Ln associated with a program verify voltage level PVn:
apply a pulse voltage to at least some of the cells;
sample a fraction of said at least some of the cells for PVn verify;
in response to a determination that a number of sampled cells that pass PVn verify is equal to or above a pre-specified threshold, determine a dynamic start voltage (DSV) to be equal to said pulse voltage;
program the cells of the memory location of the device to the nth threshold voltage level Ln including:
programming the cells based on the data for the first page while receiving the data for subsequent pages of the N pages; and
programming the cells based on the data for the subsequent pages, wherein programming the cells further includes, for at least n=1 and for each page number p, causing the DSV to be applied to the cells; and
calculate each respective DSV based on each respective page number p of N pages prior to programming the cells.

12. The flash memory device of claim 11, wherein the fraction corresponds to $1/2^{(N-p)}$.

13. The flash memory device of claim 11, wherein the predefined threshold is equal to $2^{(N-p)}*M$, wherein M is a pre-specified integer number of cells.

14. The flash memory device of claim 11, wherein said each memory chip controller is to:
compare data bit values for received ones of the N pages of data against a Gray code table, the Gray code table including distinct sets of bit values respectively representing distinct threshold voltage levels Ln for all possible integer values of n from 0 to $2^N$; and
determine, based on comparing against the Gray code table, for data received for each page p that is between 1 and N−1, whether the cells are to be at a threshold voltage level that is one of at Lp−1, or above Lp−1.

15. A method to be performed at a memory chip controller of a flash memory device comprising:
receiving data for a first page of N pages of data;
receiving data for subsequent pages of the N pages of data;
for each page number p of the N pages, and for cells of a memory location of the device, wherein the cells are to be programmed to a nth threshold voltage level Ln, Ln associated with a program verify voltage level PVn:
applying a pulse voltage to at least some of the cells;
sampling a fraction of said at least some of the cells for PVn verify;
in response to a determination that a number of sampled cells that pass PVn verify is equal to or above a pre-specified threshold, determining a dynamic start voltage (DSV) to be equal to said pulse voltage;
programming the cells of the memory location of the device to the nth threshold voltage level Ln including:
programming the cells based on the data for the first page while receiving the data for subsequent pages of the N pages; and
programming the cells based on the data for the subsequent pages, wherein programming the cells further includes, for at least n=1 and for the page number p, causing the DSV to be applied to the cells; and
calculating each respective DSV based on each respective page number p of N pages prior to programming the cells.

16. The method of claim 15, wherein
the fraction corresponds to $1/2^{(N-p)}$.

17. The method of claim 15, wherein
the predefined threshold is equal to $2^{(N-p)}*M$, wherein M is a pre-specified integer number of cells.

18. The method of claim 15, wherein the memory location is a first memory location, further including programming the cells of the first memory location while receiving data for one or more pages of N pages to be programmed in cells of a second memory location different from the first memory location.

19. A non-transitory machine readable storage medium having instructions stored thereon, the instructions, when executed by a memory chip controller of a flash memory device, to cause the memory chip controller:
receive data for a first page of N pages of data;
receive data for subsequent pages of the N pages of data;
for each page number p of the N pages, and for cells of a memory location of the device, wherein the cells are to be programmed to a nth threshold voltage level Ln, Ln associated with a program verify voltage level PVn:
apply a pulse voltage to at least some of the cells;
sample a fraction of said at least some of the cells for PVn verify;
in response to a determination that a number of sampled cells that pass PVn verify is equal to or above a pre-specified threshold, determine a dynamic start voltage (DSV) to be equal to said pulse voltage;

program the cells of the memory location of the device to the nth threshold voltage level Ln including:
programming the cells based on the data for the first page while receiving the data for subsequent pages of the N pages; and
programming the cells based on the data for the subsequent pages, wherein programming the cells further includes, for at least n=1 and for the page number p, causing the DSV to be applied to the cells; and calculate each respective DSV based on each respective page number p of N pages prior to programming the cells.

20. The machine readable storage medium of claim 19, wherein the fraction corresponds to $1/2^{(N-p)}$; or the predefined threshold is equal to $2^{(N-p)}*M$, wherein M is a pre-specified integer number of cells.

* * * * *